(12) United States Patent
Ahn et al.

(10) Patent No.: US 7,023,017 B2
(45) Date of Patent: Apr. 4, 2006

(54) THIN FILM TRANSISTOR SUBSTRATE OF HORIZONTAL ELECTRIC FIELD TYPE LIQUID CRYSTAL DISPLAY DEVICE AND FABRICATING METHOD THEREOF

(75) Inventors: Byung Chul Ahn, Gyeonggi-do (KR); Oh Nam Kwon, Gyeonggi-do (KR); Heung Lyul Cho, Gyeonggi-do (KR)

(73) Assignee: LG. Philips LCD Co., LTD, Seoul (KR)

( * ) Notice: Subject to any disclaimer, the term of this patent is extended or adjusted under 35 U.S.C. 154(b) by 0 days.

(21) Appl. No.: 10/979,096

(22) Filed: Nov. 2, 2004

(65) Prior Publication Data
US 2005/0092991 A1   May 5, 2005

(30) Foreign Application Priority Data
Nov. 4, 2003   (KR) .................. P10-2003-0077659

(51) Int. Cl.
*H01L 29/04* (2006.01)
(52) U.S. Cl. .................. 257/59; 257/59; 257/72; 257/294; 257/457; 257/749
(58) Field of Classification Search .................. 257/59, 257/72, 294, 457, 749
See application file for complete search history.

(56) References Cited

U.S. PATENT DOCUMENTS
6,953,949 B1 *  10/2005  Murade .................. 257/59

* cited by examiner

*Primary Examiner*—Mai-Huong Tran
(74) *Attorney, Agent, or Firm*—Morgan, Lewis & Bockius LLP

(57) ABSTRACT

A thin film transistor substrate of horizontal electric field type includes: a gate line and a first common line formed on a substrate to be in parallel to each other; a data line crossing the gate line and the first common line with a gate insulating film therebetween to define a pixel area; a second common line crossing the first common line having the gate insulating film therebetween; a thin film transistor connected to the gate line and the data line; a common electrode extending from the second common line in said pixel area; a pixel electrode that is parallel to the common electrode and the second common line; a protective film for covering the thin film transistor; a gate pad having a lower gate pad electrode connected to an upper gate pad electrode through a first contact hole; a common pad having a lower common pad electrode connected to an upper common pad electrode through a second contact hole; and a data pad having a lower data pad electrode connected to an upper data pad electrode provided within a third contact hole.

13 Claims, 25 Drawing Sheets

THIN FILM TRANSISTOR SUBSTRATE OF HORIZONTAL ELECTRIC FIELD TYPE LIQUID CRYSTAL DISPLAY DEVICE AND FABRICATING METHOD THEREOF

This application claims the benefit of the Korea Patent Application No. 2003-77659 filed on Nov. 4, 2003, which is hereby incorporated by reference.

BACKGROUND OF THE INVENTION

1. Field of the Invention

The present invention relates to a liquid crystal display (LCD) device, and more particularly to a thin film transistor substrate of horizontal electric field type liquid crystal display device and fabricating method thereof.

2. Description of the Related Art

Generally, liquid crystal displays (LCD) devices control light transmittance of liquid crystal using an electric field, to thereby display a picture. The liquid crystal displays are largely classified into a vertical electric field type and a horizontal electric field type depending upon the direction of the electric field driving the liquid crystal. The vertical electric field type drives a liquid crystal in a twisted nematic (TN) mode with a vertical electric field formed between a pixel electrode and a common electrode arranged in opposition to each other on the upper and lower substrate. The vertical electric field type has the advantage of a large aperture ratio while having the drawback of a narrow viewing angle of about 90°. The horizontal electric field type drives a liquid crystal in an in plane switch (IPS) mode with a horizontal electric field between the pixel electrode and the common electrode arranged in parallel to each other on the lower substrate. The horizontal electric field type has the advantage of a wide viewing angle of about 160°. Hereinafter, the liquid crystal display of horizontal electric field type will be described in detail.

The horizontal electric field type includes a thin film transistor array substrate (i.e., a lower substrate) and a color filter substrate (i.e., an upper substrate) that oppose each other and are joined to each other. A spacer is positioned between the two substrates to uniformly maintaining a cell gap between the two substrates. A liquid crystal material fills the cell gap between the two substrates. The thin film transistor array substrate includes a plurality of signal wirings for forming a horizontal electric field in each pixel, a plurality of thin film transistors and an alignment film for aligning the liquid crystal. The color filter substrate includes a color filter for implementing a color, a black matrix for preventing light leakage and an alignment film for aligning the liquid crystal.

In a horizontal electric field type liquid crystal display, the complicated fabrication of the thin film transistor substrate is a major cost factor in the manufacturing of the liquid crystal display panel because it involves a plurality of masking processes. For example, one mask process includes a lot of processes, such as thin film deposition, cleaning, photolithography, etching, photo-resist stripping and inspection processes. In order to address this issue, thin film transistor substrates have been developed that can be produced with the reduced number of masking processes. Recently, a four-mask process that excludes one mask process from the standard five-mask process has been developed.

FIG. 1 is a plan view showing a structure of a thin film transistor substrate of a horizontal electric field type liquid crystal display made using the related art four-mask process. FIG. 2 is a cross-sectional view of the thin film transistor substrate taken along the line I–I' and the line II–II' in FIG. 1. As shown in FIG. 1 and FIG. 2, the thin film transistor substrate includes a gate line 2 and a data line 4 provided on a lower substrate 45 in such a manner as to cross each other with a gate insulating film 46 therebetween. A thin film transistor 6 is adjacent to each crossing. A pixel electrode 14 and a common electrode 18 are provided at a pixel area, which is defined by the gate line 2 and the data line 4 for the purpose of forming a horizontal field. A common line 16 is connected to the common electrode 18. The thin film transistor substrate also includes a storage capacitor 20 provided at an overlap portion between the pixel electrode 14 and the common line 16. Further, a gate pad 24 is connected to the gate line 2, a data pad 30 is connected to the data line 4 and a common pad 36 is connected to the common line 16. The gate line 2 supplies a gate signal to the pixel area 5 and the data line 4 supplies a data signal to the pixel area 5. The common line 16 supplies a reference voltage for driving the liquid crystal and is provided on one side of the pixel area 5 in parallel with the gate line 2 on the other side of the pixel area 5.

The thin film transistor 6 allows the pixel signal of the data line 4 to be charged and maintained on the pixel electrode 14 in response to the gate signal of the gate line 2. The thin film transistor 6 includes a gate electrode 8 connected to the gate line 2, a source electrode 10 connected to the data line 4, and a drain electrode 12 connected to the pixel electrode 14. Further, the thin film transistor 6 includes an active layer 48 defining a channel between the source electrode 10 and the drain electrode 12. The active layer 48 overlaps a gate insulating film 46 on the gate electrode 8.

The active layer 48 also overlaps the data line 4, lower data pad electrode 32 and upper storage electrode 22. An ohmic contact layer 50 for making an ohmic contact with the data line 4 is provided on the active layer 48. In addition, the source electrode 10, the drain electrode 12, the lower data pad electrode 32 and the upper storage electrode 22 are also provided on the active layer 48.

The pixel electrode 14 is connected, via a first contact hole 13 through a protective film 52, to the drain electrode 12 of the thin film transistor 6 and is provided within the pixel area 5. The pixel electrode 14 includes a first horizontal part 14A connected to the drain electrode 12 and provided in parallel with adjacent gate lines 2, a second horizontal part 14B overlapping the common line 16, and a finger part 14C provided in parallel between the first and second horizontal parts 14A and 14B.

The common electrode 18 is connected to the common line 16 and is provided within the pixel area 5. Specifically, the common electrode 18 is provided in parallel with the finger part 14C of the pixel electrode 14 within the pixel area 5. Accordingly, a horizontal electric field can be formed between the pixel electrode 14 to which a pixel signal is supplied via the thin film transistor 6 and the common electrode 18 to which a reference voltage is supplied via the common line 16. As a result, a horizontal electric field can be formed between the finger part 14C of the pixel electrode 14 and the common electrode 18. Liquid crystal molecules arranged in the horizontal direction between the thin film transistor substrate and the color filter substrate by such a horizontal electric field are rotated due to the dielectric anisotropy. Transmittance of a light transmitting the pixel area 5 is differentiated depending upon a rotation extent of the liquid crystal molecules, thereby implementing a gray level scale.

The storage capacitor 20 includes an upper storage electrode 22 overlapping the common line 16 with the gate insulating film 46, the active layer 48 and the ohmic contact layer 50 therebetween. The storage capacitor 20 further includes a pixel electrode 14 connected, via a second contact hole 21 provided in the protective film 52, to the upper storage electrode 22. The storage capacitor 20 allows a pixel signal charged on the pixel electrode 14 to be stably maintained until the next pixel signal is charged.

The gate line 2 is connected, via the gate pad 24, to a gate driver (not shown). The gate pad 24 consists of a lower gate pad electrode 26 extending from the gate line 2 and an upper gate pad electrode 28 connected, via a third contact hole 27 through the gate insulating film 46 and the protective film 52, to the lower gate pad electrode 26. The data line 4 is connected via the data pad 30 to the data driver (not shown). The data pad 30 consists of a lower data pad electrode 32 extending from the data line 4 and an upper data pad electrode 34 connected, via a fourth contact hole 33 through the protective film 52, to the lower data pad electrode 32. The common line 16 receives a reference voltage from an external reference voltage source (not shown) through the common pad 36. The common pad 36 includes a lower common pad electrode 38 extending from the common line 16 and an upper common pad electrode 40 connected, via a fifth contact hole 39 through the gate insulating film 46 and the protective film 52, to the lower common pad electrode 38.

A method of fabricating the thin film transistor substrate having the above-mentioned structure using the four-round mask process will be described in detail with reference to FIGS. 3A to 3D. Referring to FIG. 3A, a gate metal pattern group including the gate line 2, the gate electrode 8 and the lower gate pad electrode 26, the common line 16, the common electrode 18 and the lower common pad electrode 38 is provided on the lower substrate 45 by a first mask process.

The gate metal pattern group is formed by first forming a gate metal layer on the upper substrate 45 by a deposition technique, such as sputtering. Then, the gate metal layer is patterned by photolithography and an etching process using a first mask, to thereby form the gate metal pattern group including the gate line 2, the gate electrode 8, the lower gate pad electrode 26, the common line 16, common electrode 18 and the lower common pad electrode 38. The gate metal layer is formed from a metal, such as aluminum-alloy, chrome (Cr) or molybdenum (Mo).

Referring to FIG. 3B, the gate insulating film 46 is coated onto the lower substrate 45 provided with the gate metal pattern group. Further, a semiconductor pattern including the active layer 48 and the ohmic contact layer 50, and a source/drain metal pattern group including the data line 4, the source electrode 10, the drain electrode 12, the lower data pad electrode 32 and the upper storage electrode 22 are provided on the gate insulating film 46 by a second mask process. More specifically, the gate insulating film 46, an amorphous silicon layer, an n$^+$ amorphous silicon layer and a source/drain metal layer are sequentially provided over the lower substrate 45 having the gate metal pattern group by the appropriate deposition techniques, such as plasma enhanced chemical vapor deposition (PECVD) and/or sputtering. Herein, the gate insulating film 46 is formed from an inorganic insulating material, such as silicon nitride (SiN$_x$) or silicon oxide (SiO$_x$). The source/drain metal is made from molybdenum (Mo), titanium (Ti), tantalum (Ta) or a molybdenum alloy.

Then, a photo-resist pattern is formed on the source/drain metal layer by the photolithography using the second mask. In this case, a diffractive exposure mask having a diffractive exposing part corresponding to a channel portion of the thin film transistor is used as the second mask, thereby allowing a photo-resist pattern of the channel portion to have a height lower than other pattern portions.

Subsequently, the source/drain metal layer is patterned by a wet etching process using the photo-resist pattern, to thereby define the source/drain metal pattern group including the data line 4, the source electrode 10, the drain electrode 12 being integral to the source electrode 10 and the upper storage electrode 22.

Next, the photo-resist pattern having a relatively low height is removed from the channel portion by any ashing process and thereafter the source/drain metal pattern and the ohmic contact layer 50 of the channel portion are etched by a dry etching process. Thus, the active layer 48 of the channel portion is exposed to disconnect the source electrode 10 from the drain electrode 12. Then, the photo-resist pattern left on the source/drain metal pattern group is removed by a stripping process.

Referring to FIG. 3C, the protective film 52 includes first to fifth contact holes 13, 21, 27, 33 and 39 formed in the gate insulating film 46 by a third mask process. More specifically, the protective film 52 is deposited over the entire surface of the source/drain metal pattern group by a deposition technique, such as plasma enhanced chemical vapor deposition (PECVD). The protective film 52 is patterned by a photolithography and etching process using a third mask to define the first to fifth contact holes 13, 21, 27, 33 and 39. The first contact hole 13 passes through the protective film 52 to expose the drain electrode 12. The second contact hole 21 passes through the protective film 52 to expose the upper storage electrode 22. The third contact hole 27 passes through the protective film 52 and the gate insulating film 46 to expose the lower gate pad electrode 26. The fourth contact hole 32 passes through the protective film 52 to expose the lower data pad electrode 32. The fifth contact hole 30 passes through the protective film 52 and the gate insulating film 48 to expose the lower common pad electrode 38. If the source/drain metal is formed from a metal having a high dry-etching ratio, such as molybdenum (Mo), then the first, second and fourth contact holes 13, 21 and 33 will respectively pass through the drain electrode 12, the upper storage electrode 22 and the lower data pad electrode 32 so as to expose side surfaces of these electrodes. The protective film 50 is formed from an inorganic material identical to the gate insulating film 46, or an organic material having a low dielectric constant, such as an acrylic organic compound, BCB (benzocyclobutene) or PFCB (perfluorocyclobutane).

Referring to FIG. 3D, a transparent conductive film pattern group including the pixel electrode 14, the upper gate pad electrode 28, the upper data pad electrode 34 and the upper common pad electrode 40 are provided on the protective film 52 by a fourth mask process. More specifically, a transparent conductive film is coated onto the protective film 52 by a deposition technique, such as sputtering. Then, the transparent conductive film is patterned by a photolithography and etching process using the fourth mask to form the transparent conductive pattern group including the pixel electrode 14, the upper gate pad electrode 28, the upper data pad electrode 34 and the upper common pad electrode 40. The pixel electrode 14 is electrically connected, via the first contact hole 13, to the drain electrode 12 while also being electrically connected, via the second contact hole 21, to the upper storage electrode 22. The upper gate pad electrode 28 is electrically connected, via the third contact hole 37, to the lower gate pad electrode 26. The upper data pad electrode 34 is electrically connected, via the fourth contact hole 33, to the lower data pad electrode 32. The upper common pad electrode 40 is electrically connected, via the fifth contact hole 39, to the lower common pad electrode 38. The transparent conductive film is formed from indium-tin-oxide (ITO), tin-oxide (TO) or indium-zinc-oxide (IZO).

The related art thin film transistor substrate of horizontal electric field type and the fabricating method thereof as mentioned above uses a four-round mask process, thereby reducing the number of fabricating processes and hence reducing manufacturing cost in comparison with those using the five-round mask process. However, since the four-round mask process still is a complicated fabricating process. Thus, a further cost reduction is limited. There is still a need to simplify the fabricating process and reduce the manufacturing cost.

SUMMARY OF THE INVENTION

Accordingly, it is an object of the present invention to provide a thin film transistor substrate of horizontal electric field type liquid crystal display device and a fabricating method thereof that substantially obviates one or more of the problems due to limitations and disadvantages of the related art.

An object of the present invention is to provide a thin film transistor substrate of horizontal electric field type liquid crystal display device and a fabricating method thereof having a simplified manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a thin film transistor substrate of horizontal electric field applying type according to one aspect of the present invention includes: a gate line and a first common line formed from a first conductive layer on a substrate to be in parallel to each other; a data line crossing the gate line and the first common line with a gate insulating film therebetween to define a pixel area, said data line being formed from a second conductive layer; a second common line formed from said second conductive layer and crossing the first common line having the gate insulating film therebetween; a thin film transistor connected to the gate line and the data line; a common electrode formed from said second conductive layer and extending from the second common line in said pixel area; a pixel electrode formed from said second conductive layer that is parallel to the common electrode and the second common line; a protective film for covering the thin film transistor; a gate pad having a lower gate pad electrode connected to the gate line and an upper gate pad electrode connected to the lower gate pad electrode within a first contact hole, the lower gate pad electrode being formed form the first conductive layer and the upper gate pad electrode being formed form a third conductive layer; a common pad having a lower common pad electrode connected to the first common line and an upper common pad electrode connected to the lower common pad electrode within a second contact hole, the lower common pad electrode being formed from the first conductive layer and the upper common pad electrode being formed from the third conductive layer; and a data pad having a lower data pad electrode connected to the data line and an upper data pad electrode connected to the lower data pad electrode within a third contact hole, the lower data pad electrode being formed from the second conductive layer and the upper data pad electrode being formed form the third conductive layer.

In another aspect, a method of fabricating a thin film transistor substrate of horizontal electric field type includes the steps of: depositing a first conductive layer on a substrate; forming a gate line, a gate electrode connected to the gate line, a lower gate pad electrode a first common line in parallel to the gate line and a lower common pad electrode connected to the first common line from said first conductive layer; coating a gate insulating film over the gate line, the gate electrode, the lower gate pad electrode, the first common line and the common pad electrode; depositing a semiconductor layer and a second conductive layer on the gate insulating film; forming a semiconductor pattern from the semiconductor layer; forming a data line crossing the gate line and the common line, a source electrode and a lower data pad electrode connected to the data line, a drain electrode opposed to the source electrode and a pixel electrode connected to the drain electrode from a second conductive layer on said semiconductor pattern; forming a second common line in parallel to the data line and a common electrode extending from the second common line to make an horizontal electric field along with the pixel electrode from said second conductive layer on the semiconductor pattern; coating a protective film over the substrate; patterning the protective film and the gate insulating film to provide first to third contact holes for exposing the lower gate pad electrode, the lower common pad electrode and the lower data pad electrode; and patterning a third conductive layer to provide an upper gate pad electrode, an upper common pad electrode and an upper data pad electrode within said first to third contact holes, respectively.

In yet another aspect, method of fabricating a thin film transistor substrate of horizontal electric field type includes: a first mask process of forming a gate line, a gate electrode and a lower gate pad electrode connected to the gate line, a first common line in parallel to the gate line and a lower common pad electrode connected to the first common line from a first conductive layer on a substrate; a second mask process of depositing a gate insulating film and forming a data line crossing the gate line and the first common line, a source electrode and a lower data pad electrode connected to the data line, a drain electrode opposed to the source electrode, a pixel electrode connected to the drain electrode, a second common line in parallel to the data line and a common electrode connected to the second common line and being parallel to the pixel electrode from said second layer on said semiconductor pattern; and a third mask process of depositing a protective film, patterning the protective film and the gate insulating film to define first to third contact holes for exposing the lower gate pad electrode, the lower common pad electrode and a lower data pad electrode, respectively, and forming an upper gate pad electrode, an upper common pad electrode and an upper data pad electrode within the first to third contact holes, respectively.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of the present invention will be described in detail with reference to FIGS. 4 to 13.

Figure 1:
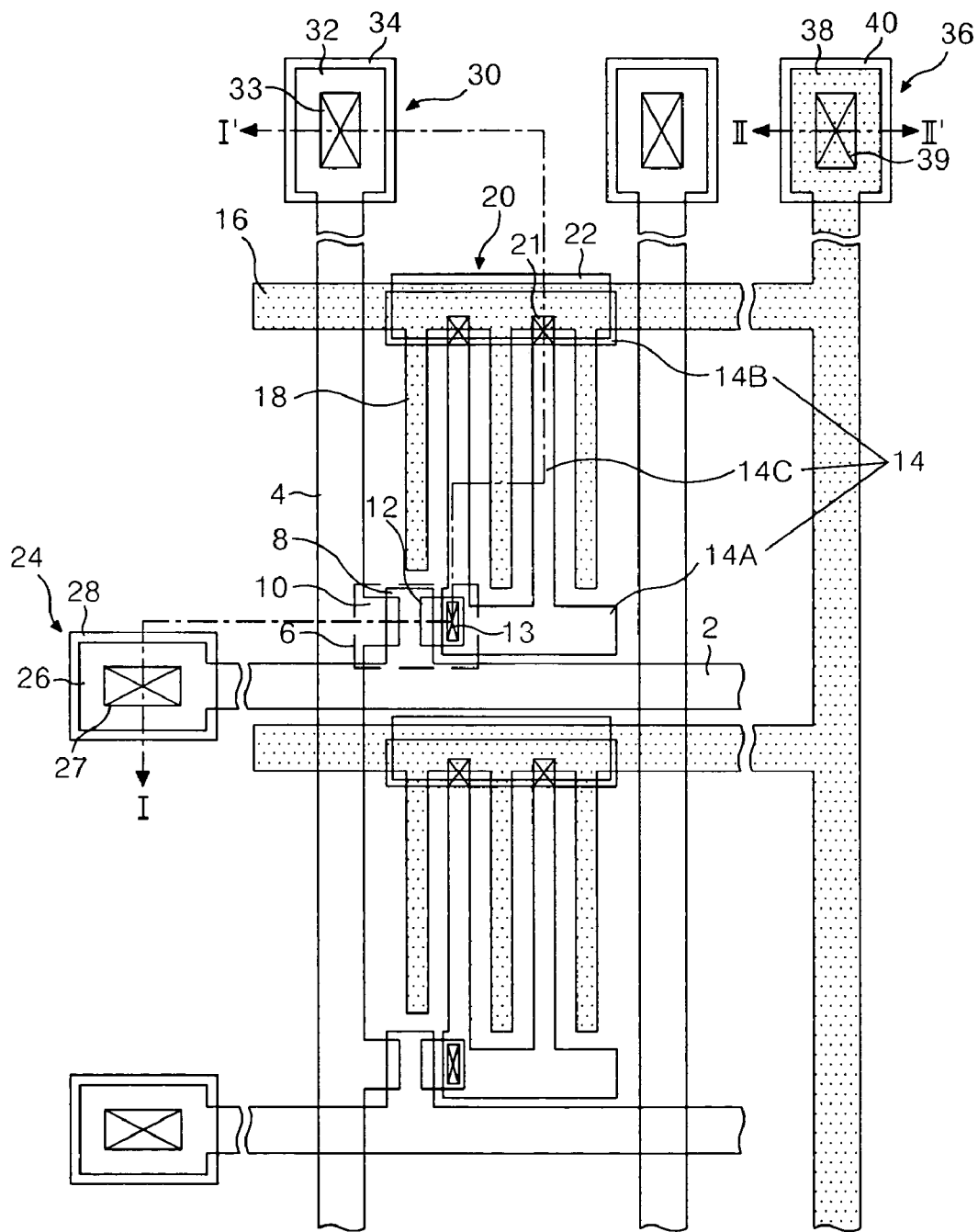
FIG. 1 is a plan view showing a structure of a related art thin film transistor substrate of a horizontal electric field type liquid crystal device.
Figure 2:
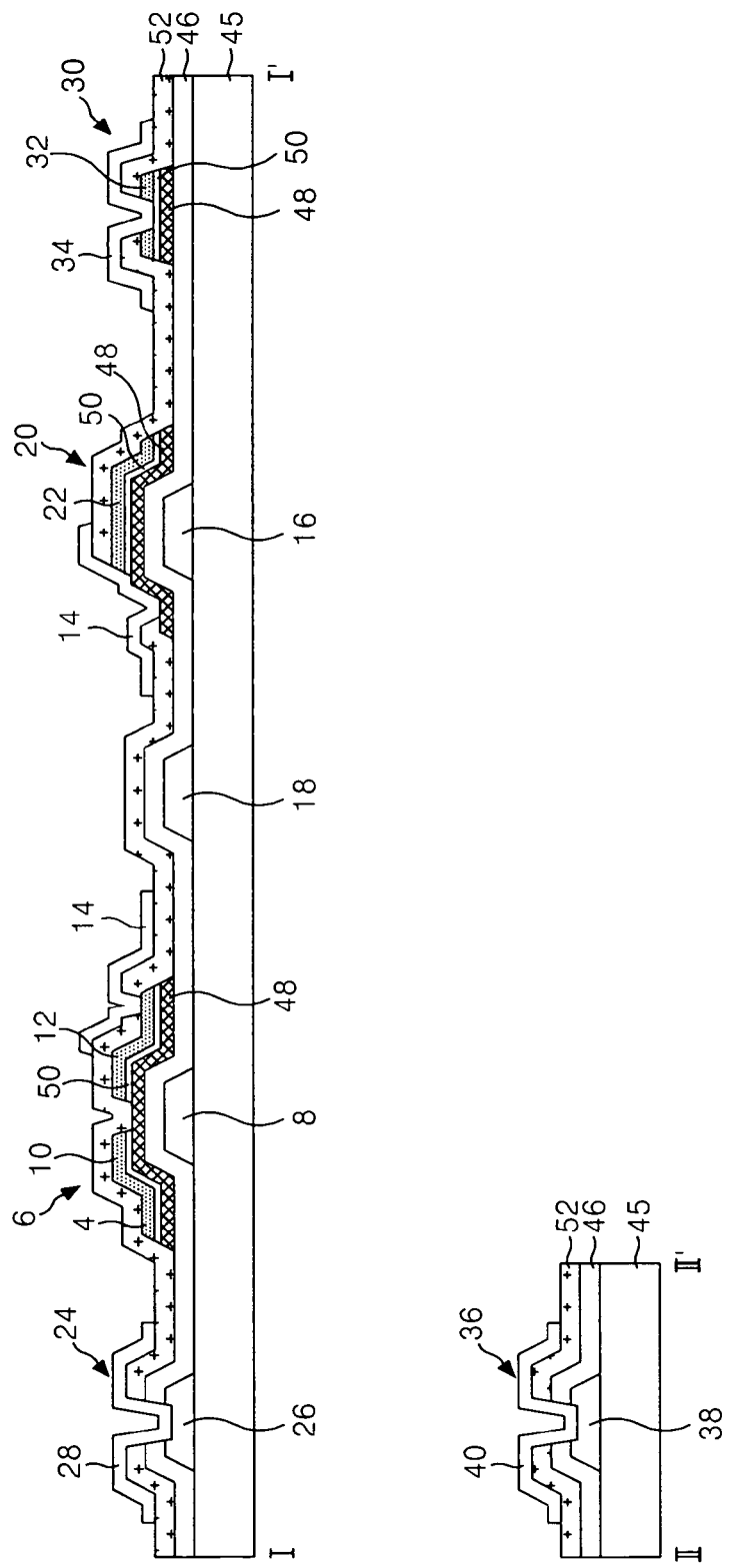
FIG. 2 is a cross-sectional view of the thin film transistor substrate taken along the lines I–I' and II–II' in FIG. 1.
Figure 3A:
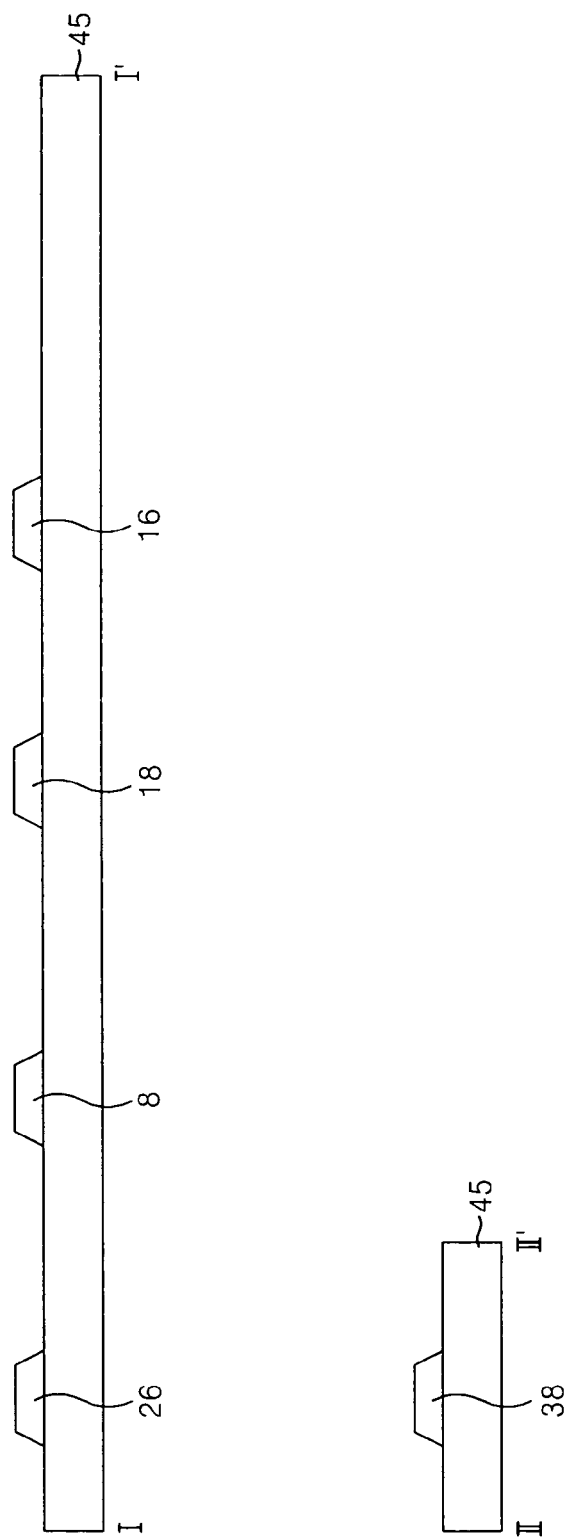
FIGS. 3A to 3D are cross-sectional views illustrating a method of fabricating the thin film transistor substrate shown in FIG. 2 step by step.
Figure 3B:
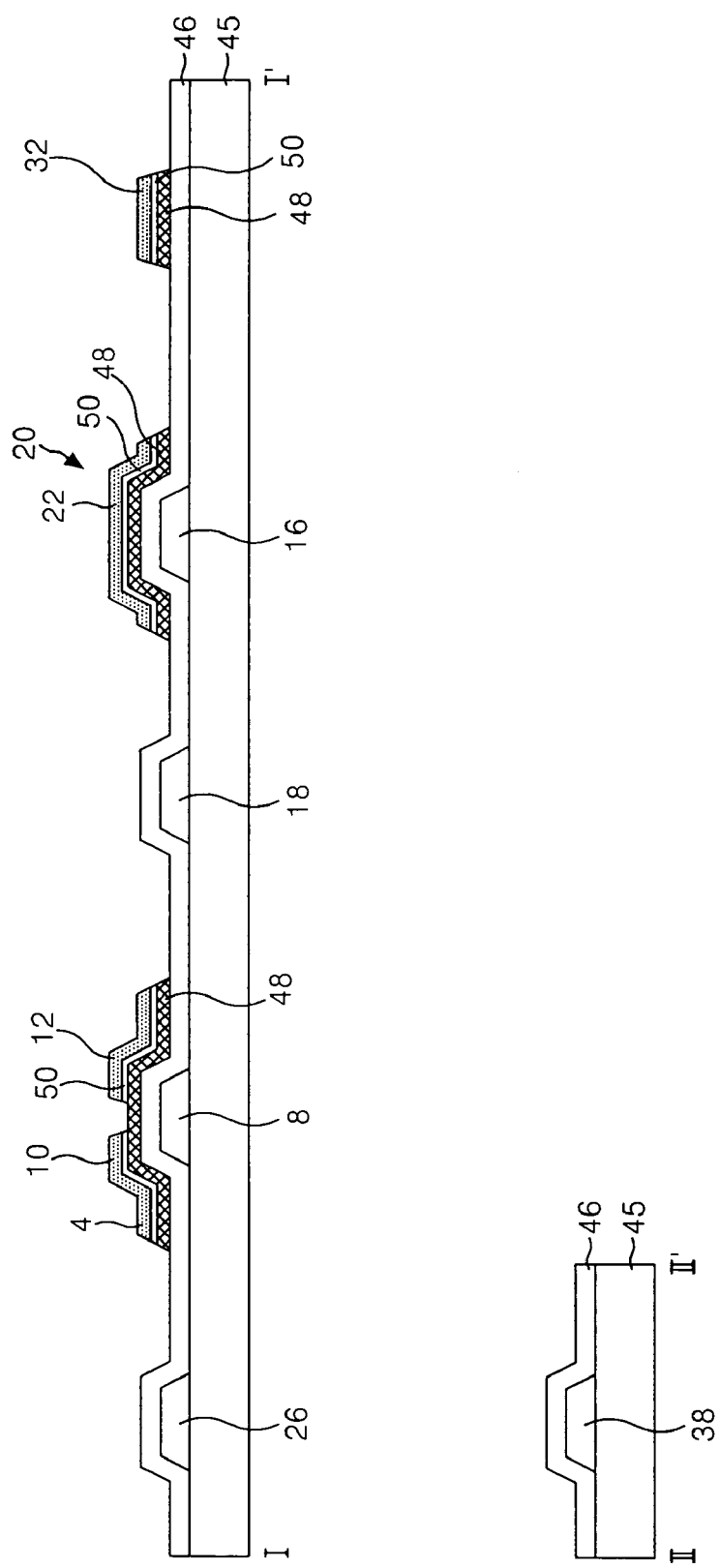
Figure 3C:
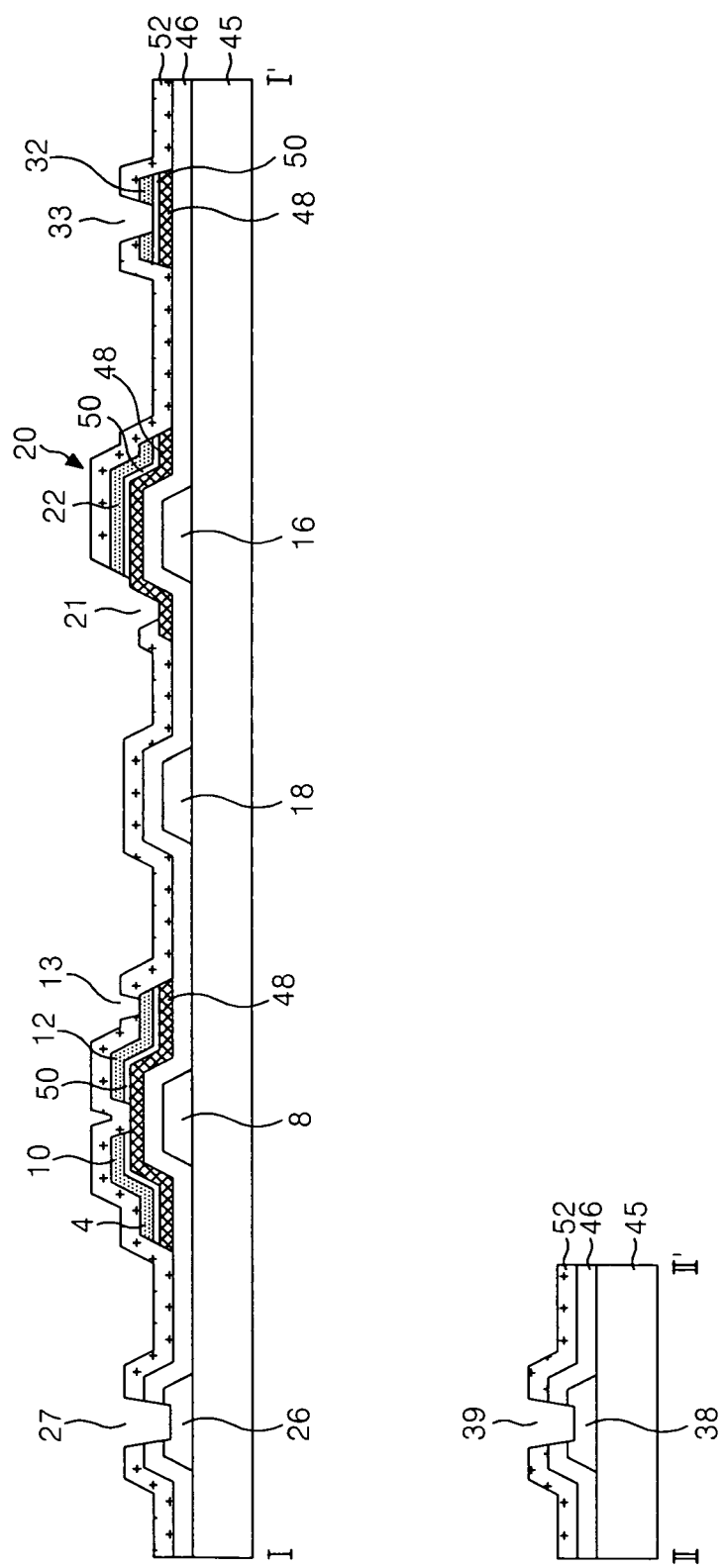
Figure 3D:
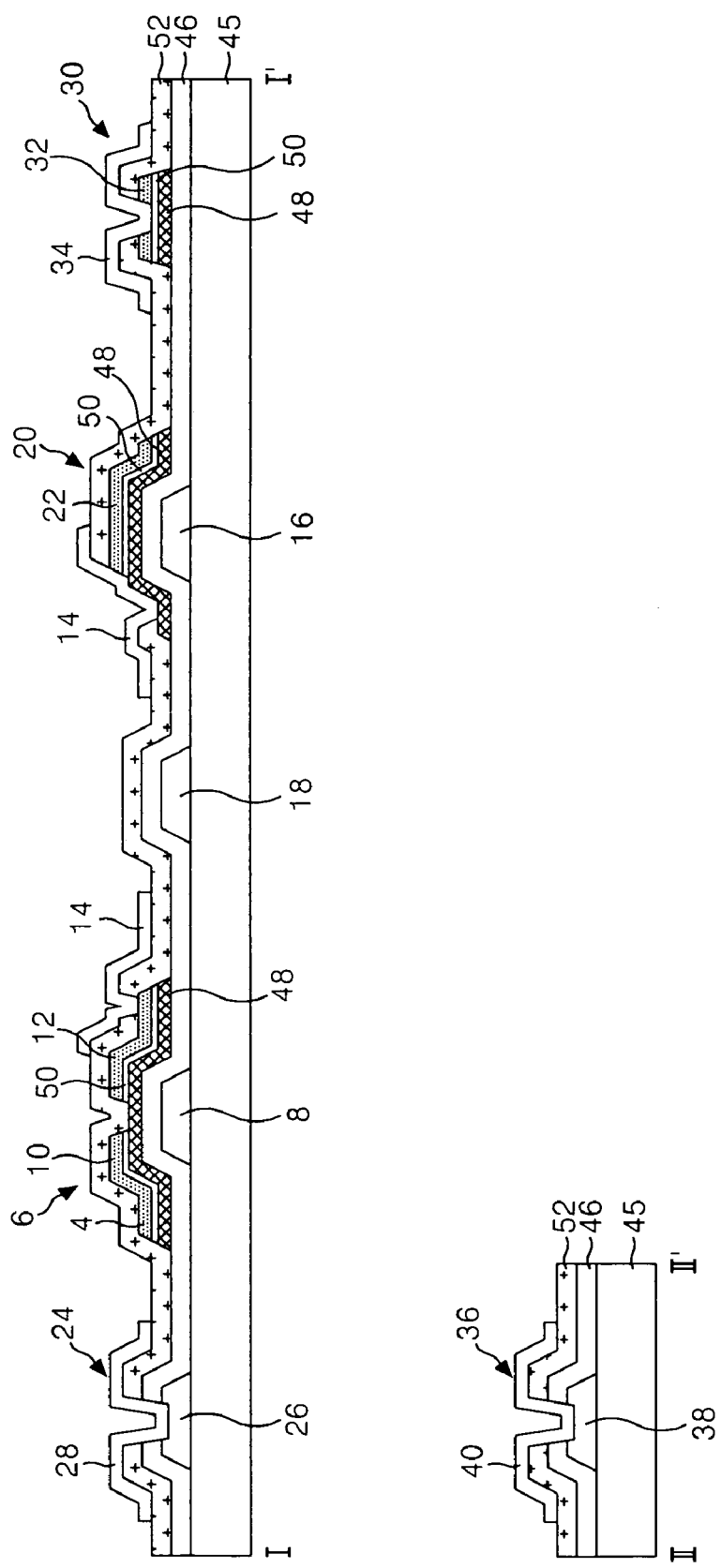
Figure 4:
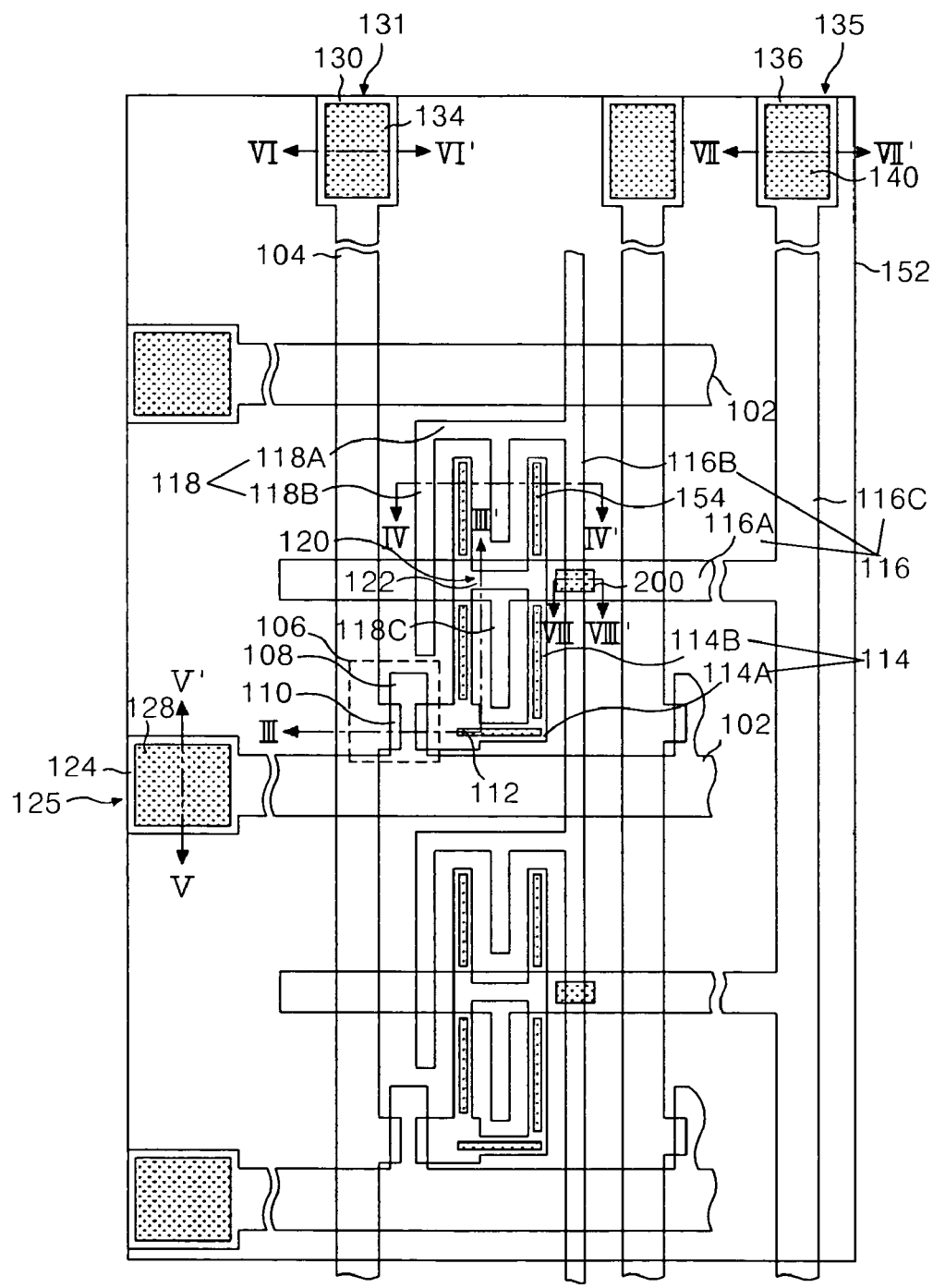
FIG. 4 is a plan view showing a structure of a thin film transistor substrate of horizontal electric field type according to an embodiment of the present invention.
Figure 5:
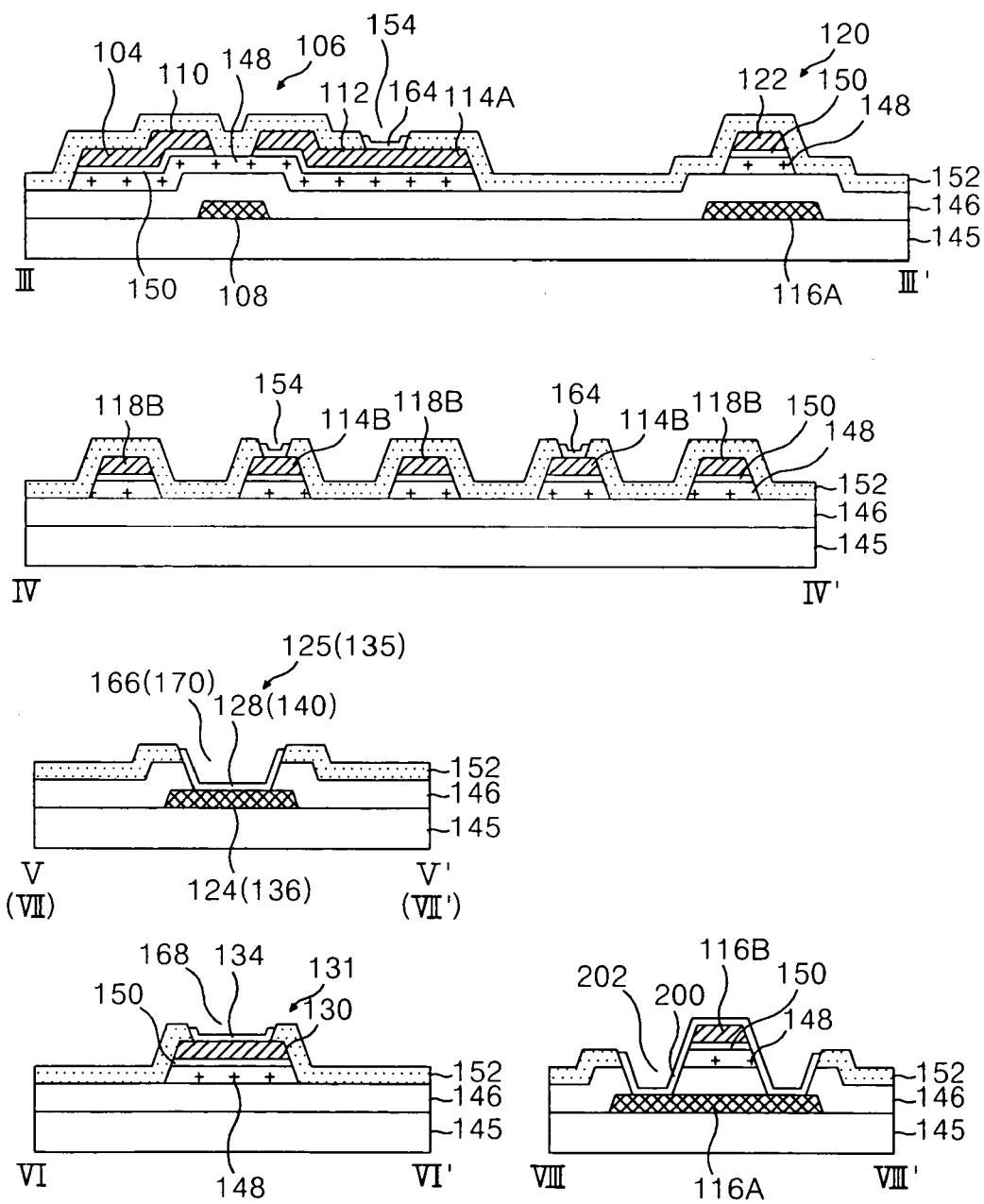
FIG. 5 is a cross-sectional view of the thin film transistor substrate taken along the lines III–III', IV–IV', V–V', VI–VI', VII–VII' and VII–VII' and in FIG. 4.

FIG. 4 is a plan view showing a structure of a thin film transistor substrate of a horizontal electric field type liquid crystal display device according to an embodiment of the present invention, and FIG. 5 is a cross-sectional view of the thin film transistor substrate taken along the lines III–III', IV–IV', V–V', VI–VI', VII–VII' and VIII–VIII' in FIG. 4.

Referring to FIG. 4 and FIG. 5, the thin film transistor substrate includes a gate line 102 and a data line 104 provided on a lower substrate 145 in such a manner to cross each other with having a gate insulating film 146 therebetween. The gate line 102 and the data line 104 define a pixel area. A thin film transistor 106 provided in each pixel area. A pixel electrode 114 and a common electrode 118 are provided in each pixel area for the purpose of forming a horizontal field to rotate a liquid crystal material. A common line 116 is connected to the common electrode 118. The thin film transistor substrate also includes a storage capacitors 120 having an upper storage electrode 122 overlapping the common line 116. Further, the thin film transistor substrate includes a gate pad 125 connected to the gate line 102, a data pad 131 connected to the data line 104, and a common pad 135 connected to the common line 116. The gate line 102 is supplied with a gate signal and the data line 104 is supplied with a data signal.

The thin film transistor 106 allows the data signal of the data line 104 to be charged and maintained on the pixel electrode 114 in response to the gate signal of the gate line 102. To this end, the thin film transistor 106 includes a gate electrode 108 connected to the gate line 102, a source electrode 110 connected to the data line 104, a drain electrode 112 opposed to the source electrode 110, an active layer 148 overlapping the gate electrode 108 with a gate insulating film 146 therebetween to define a channel region between the source electrode 110 and the drain electrode 112, and an ohmic contact layer 150 provided on the active layer 148 excluding the channel to make an ohmic contact with the source electrode 110 and the drain electrode 112. Further, the active layer 148 and the ohmic contact layer 150 overlaps the data line 104, a lower data pad electrode 130 and the upper storage electrode 122 that are formed from a second conductive layer along with the source electrode 110 and the drain electrode 112.

The common line 116 and the common electrode 118 supply a reference for driving a liquid crystal. The common line 116 includes a first common line 116A arranged in parallel to the gate line 102 in the display area, and a second common line 116B connected in parallel to the data line 104 in such a manner as to cross the first common line 116A. In other words, the first common line 116A is provided across the pixel area in a first direction, whereas the second common line 116B is provided across the pixel area in a second direction, which is orthogonal to the first direction. Further, the common line 116 includes a third common line 116C connected to a plurality of first common lines 116A in the non-display area. Herein, the first and third common lines 116A and 116C are formed from a first conductive layer (or gate metal layer) along with the gate line 102, whereas the second common line 116B is formed from a second conductive layer (or source/drain metal layer) along with the data line 104. Thus, the second common line 116B of the second conductive layer is connected, via a contact electrode 200, to the first common line 116A of said first conductive layer. The contact electrode 200 is provided across the second common line 116B at a crossing part between the first and second common lines 116A and 116B, and is provided within a fourth contact hole 202 for exposing the first and second common lines 116A and 116B.

The common electrode 118 is connected to the second common line 116B, and is formed in a finger shape in the pixel area in such a manner as to be parallel to the pixel electrode 114. More specifically, the common electrode 118 includes a first common electrode 118A protruding from the second common line 116B in the pixel area in such a manner as to be parallel to the gate line 102, and a second common electrode 118B protruding from the first common electrode 118A in such a manner as to be parallel to the pixel electrode 114. For instance, one second common electrode 118B adjacent to the data line 102 of the plurality of second common electrodes 118B extends in such a manner as to cross the first common line 116A while the remaining other second common electrode 118B located in the middle portion extends just before the first common line 116A so as not to cross the common line 116A. The first and second common electrodes 118A and 118B are formed from the second conductive layer along with the second common line 116B. Further, when the first common line 116B is provided across the middle portion of the pixel area, as shown in FIG. 4, the common electrode 118 includes a third common electrode 118C protruding from the first common line 116A in such a manner as to be parallel to the pixel electrode 114. Such a third common electrode 118C is formed from the first conductive layer along with the first common line 116A, and is arranged in line with any one of the plurality of second common electrodes 118B.

The pixel electrode 114 is connected to the drain electrode 112 of the thin film transistor 106 and forms a horizontal electric field with the common electrode 118 in the pixel area. Also, the pixel electrode 114 forms a horizontal electric field with the second common line 116B. The pixel electrode 114 is comprised of a horizontal part 114A provided in parallel to the gate line 102 and connected to the drain electrode 112, and a finger part 114B extending from the horizontal part 114A into the pixel area and in parallel to the common electrode 118 and the second common line 116B. The pixel electrode 114 is formed from the second conductive layer along with the data line 104, the source electrode 110 and the drain electrode 112. Thus, a horizontal electric field is formed between the pixel electrode 114 to which a data signal is applied via the thin film transistor 106 and the common electrode 118 and the second common line 116B to which a reference voltage is applied via the common line 116. Liquid crystal molecules between the thin film transistor substrate and the color filter are rotated into the horizontal direction by such a horizontal electric field due to the dielectric anisotropy. Transmittance of light transmitting through the pixel area is differentiated depending upon the rotation extent of the liquid crystal molecules, thereby implementing a gray level scale.

The storage capacitor consists of a portion of the first common line 116A, which is a first lower storage electrode, and the upper storage electrode 122 that overlaps a portion of the first common line 116A. A gate insulating film 146, the active layer 148 and the ohmic contact layer 150 is between the first common line 116A and the upper storage electrode 122. The upper storage electrode 122 is connected between the finger parts 114B of the pixel electrode 114 crossing the first common line 116A and is formed from the second conductive layer along with the pixel electrode 114. Such a storage capacitor allows a pixel signal charged in the pixel electrode 114 to be stably maintained until the next pixel signal is charged.

The gate line 102 is connected, via the gate pad 125, to a gate driver (not shown). The gate pad 125 consists of a lower gate pad electrode 124 extending from the gate line 102, and an upper gate pad electrode 128 connected, via a first contact hole 166 through the gate insulating film 146 and the protective film 152, to the lower gate pad electrode 124.

The common line 116 receives a reference voltage from an external reference voltage source (not shown) through the common pad 135. The common pad 135 includes a lower common pad electrode 136 extending from the common line 116, and an upper common pad electrode 140 connected, via a second contact hole 170 through the gate insulating film 146 and the protective film 152, to the lower common pad electrode 136.

The data line 104 is connected, via the data pad 131, to the data driver (not shown). The data pad 131 includes a lower data pad electrode 130 extending from the data line 104, and an upper data pad electrode 134 connected, via a third contact hole 168 through the protective film 152, to the lower data pad electrode 130. In such a thin film transistor substrate, the upper gate pad electrode 128, the upper data pad electrode 134 and the upper common pad electrode 140 are formed from a third conductive layer along with the contact electrode 200. The third conductive layer is patterned by a lift-off process by removing a photo-resist pattern used for patterning of the protective film 152 and the gate insulating film 146. Thus, the patterned third conductive layer makes an interface with the protective film 152. The thin film transistor substrate according to an embodiment of the present invention eliminates the mask process of patterning the third conductive layer by using such a lift-off process.

To enhance lift-off ability, a stripper penetration path 154 through the gate insulating film 146 and the protective film 152, or the protective film 152 on the above-mentioned signal lines and electrodes are provided. For instance, the stripper penetration path 154 is provided on the pixel electrode 114, the common electrode 118 or the second common line 116B in such a manner to pass through the protective film. Such a stripper penetration path 154 is provided at a portion having no photo-resist pattern to allow easy infiltration of a stripper into the interface portion between the photo-resist pattern and the protective film 152, thereby improving lift-off ability of the photo-resist pattern. Further, the first to fourth contact holes 166, 170, 168 and 202 also are used as stripper penetration paths, to thereby enhance lift-off ability of the photo-resist pattern. A method of fabricating the thin film transistor substrate according to an embodiment of the present invention having such an advantage will be described in detail below.

Figure 6A:
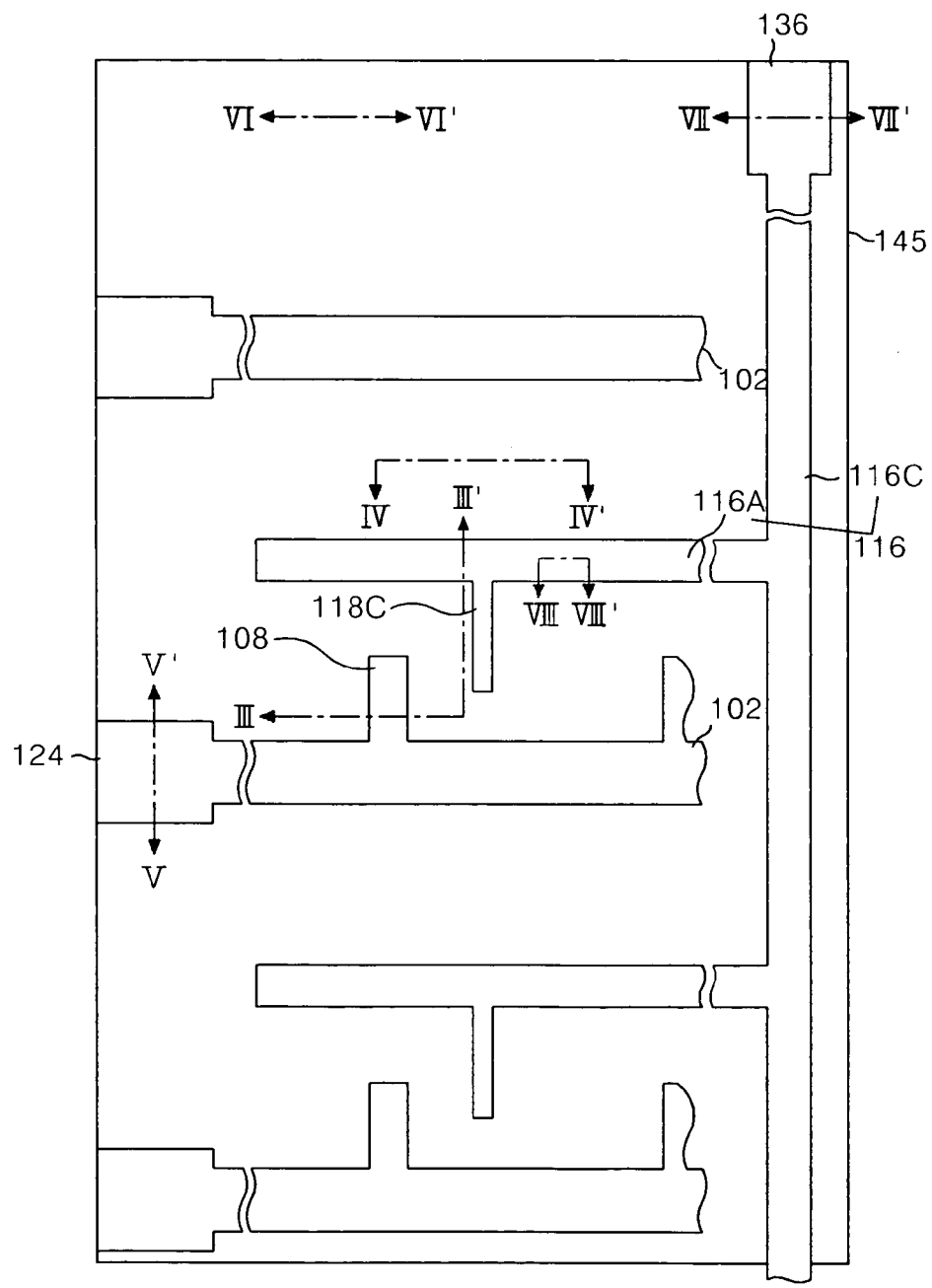
FIG. 6A and FIG. 6B are a plan view and a cross-sectional view for explaining a first mask process in a fabricating method of the thin film transistor substrate according to an embodiment of the present invention, respectively.
Figure 6B:
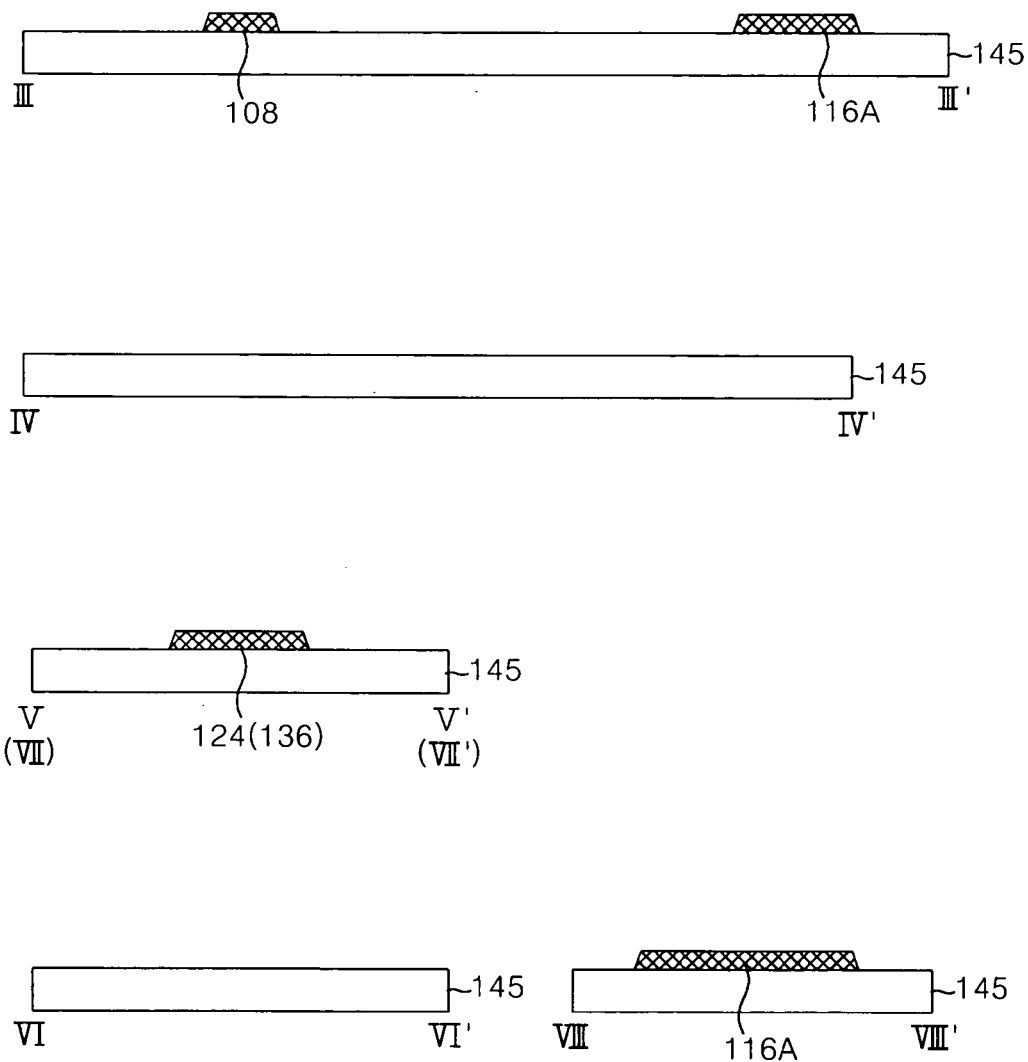

FIG. 6A and FIG. 6B are a plan view and a cross-sectional view for explaining a first mask process in a fabricating method of the thin film transistor substrate of horizontal electric field applying type according to an embodiment of the present invention, respectively. As shown in FIG. 6A and FIG. 6B, a first conductive pattern group including the gate line 102, the gate electrode 108, the lower gate pad electrode 124, the first and third common lines 116A and 116C, the third common electrode 118C and the lower common pad electrode 136 is provided on the lower substrate 145 by the first mask process. More specifically, a first conductive layer is formed on the upper substrate 145 by a deposition technique, such as sputtering. Then, the first conductive layer is patterned by a photolithography and an etching process using a first mask to thereby form the first conductive pattern group including the gate line 102, the gate electrode 108, the lower gate pad electrode 124, the first and third common lines 116A and 116C, the third common electrode 118C and the lower common pad electrode 136. The first conductive layer is formed from Cr, MoW, Cr/Al, Cu, Al(Nd), Mo/Al, Mo/Al(Nd) or Cr/Al(Nd).

Figure 7A:
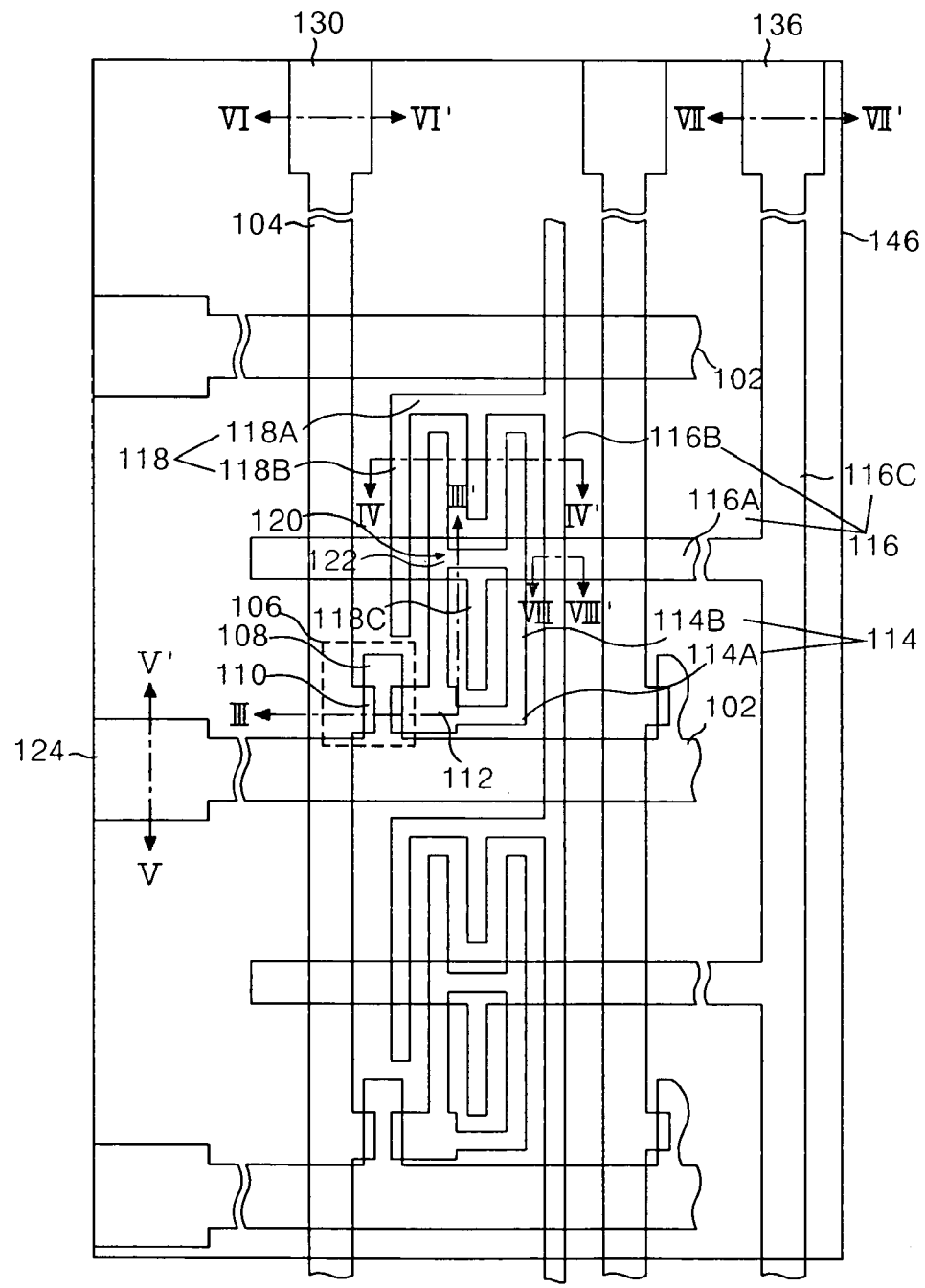
FIG. 7A and FIG. 7B are a plan view and a cross-sectional view for explaining a second mask process in a fabricating method of the thin film transistor substrate according to an embodiment of the present invention, respectively.
Figure 7B:
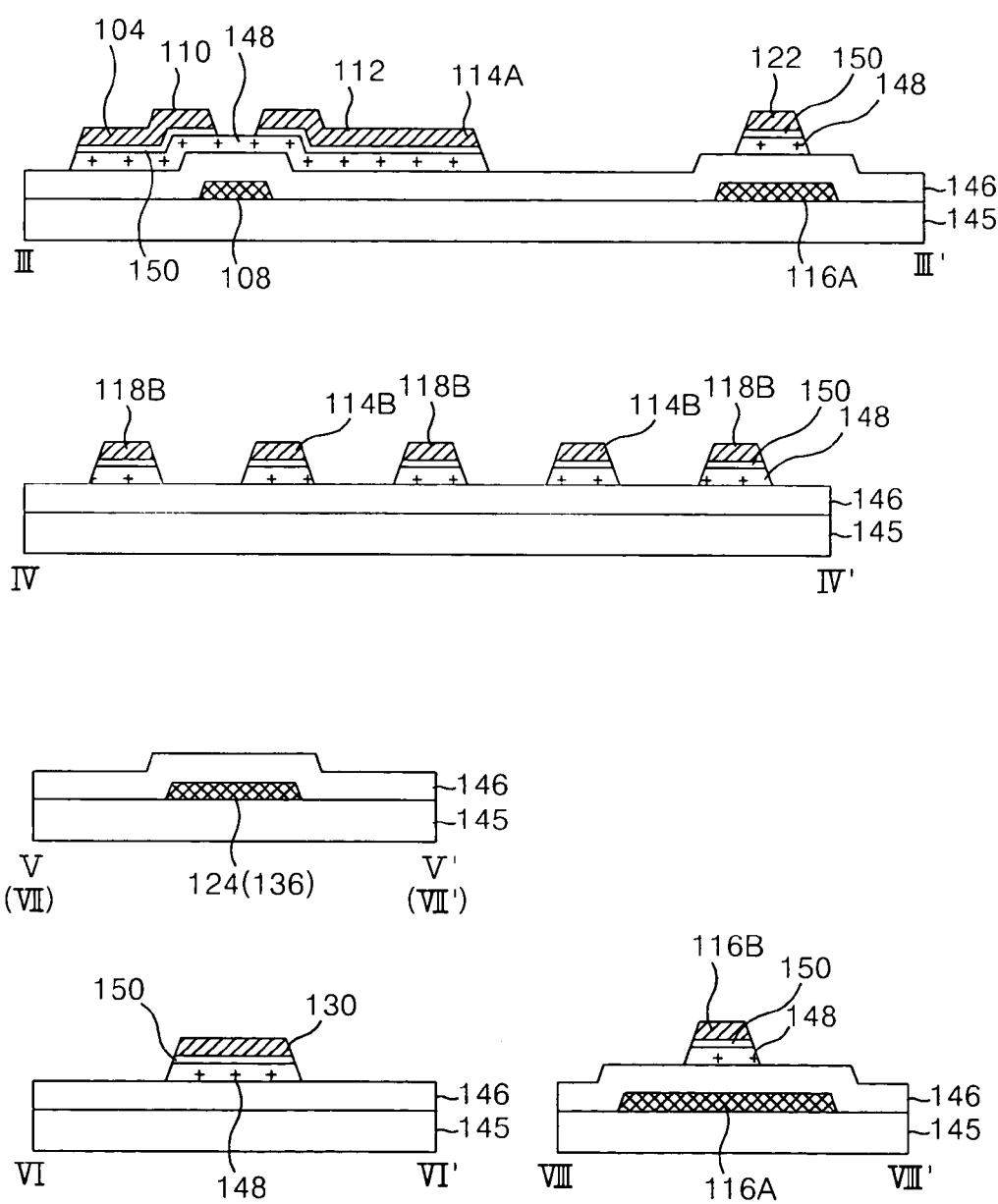

FIG. 7A and FIG. 7B are a plan view and a cross-sectional view for explaining a second mask process in a fabricating method of the thin film transistor substrate of horizontal electric field type according to an embodiment of the present invention, respectively, and FIG. 8A to FIG. 8D are cross-sectional views for specifically explaining the second mask process.

First, the gate insulating film 146 is formed over the lower substrate 145 by a deposition technique, such as plasma enhanced chemical vapor deposition (PECVD), sputtering and the like. Herein, the gate insulating film 146 is formed from an inorganic insulating material, such as silicon nitride ($SiN_x$) or silicon oxide ($SiO_x$).

As shown in FIG. 7A and FIG. 7B, a semiconductor pattern including the active layer 148 and an ohmic contact layer 150 is disposed on the gate insulating film 146; and a second conductive pattern group including the data line 104, the source electrode 110, the drain electrode 112, the first and second common electrodes 118A and 118B, the pixel electrode 114, the lower data pad electrode 130 and the upper storage electrode 122 are provided by using a second mask process. The pixel electrode 114 and the common electrode 118 are formed an opaque second transparent layer, thereby preventing a light leakage.

Figure 8A:
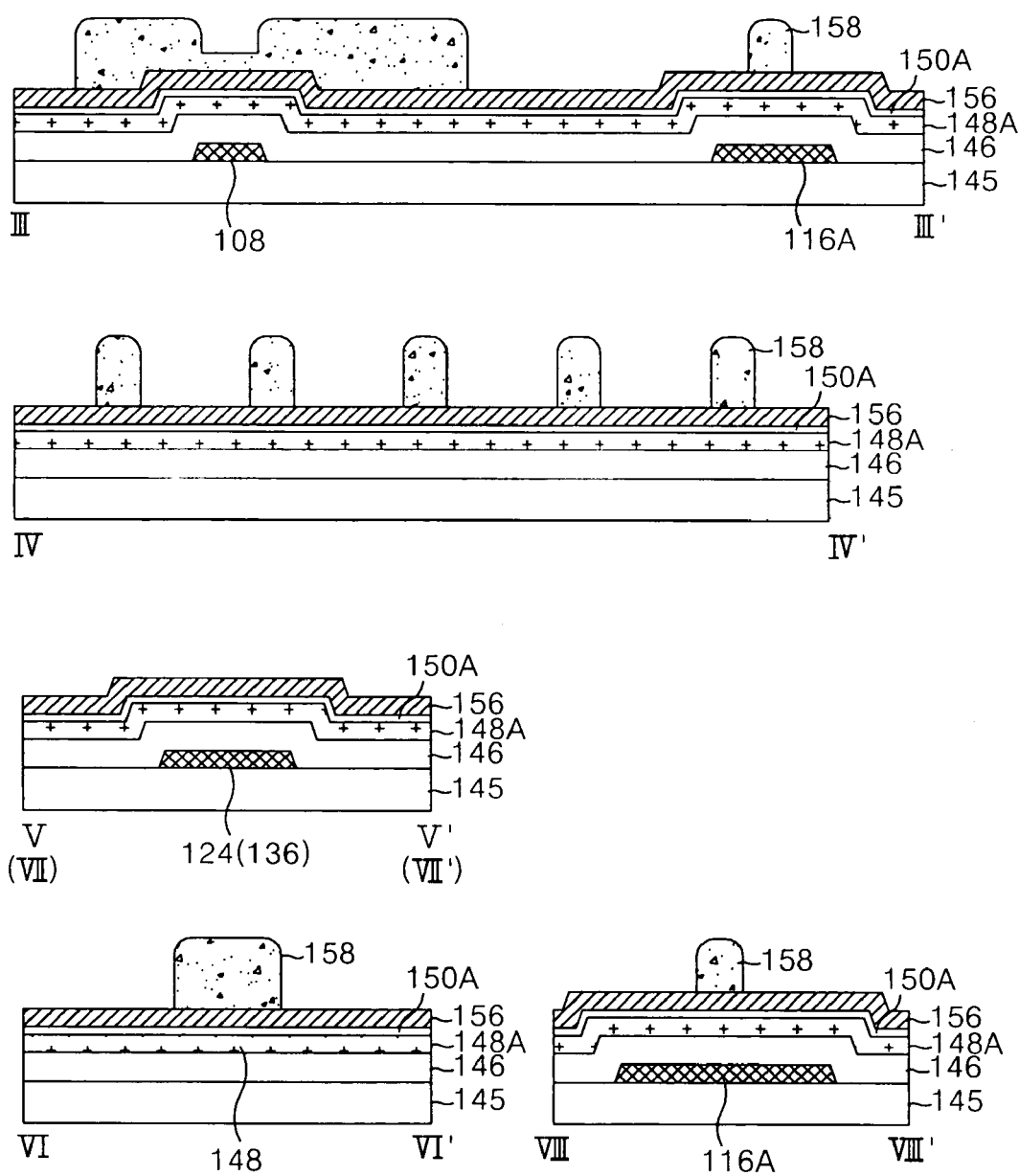
FIG. 8A to FIG. 8D are section views for specifically explaining the second mask process in a fabricating method of the thin film transistor substrate according to an embodiment of the present invention.

More specifically, as shown in FIG. 8A, an amorphous silicon layer 148A, an n+ amorphous silicon layer 150A and the second conductive layer 156 are sequentially formed on the gate insulating film 146 by deposition techniques, such as plasma enhanced chemical vapor deposition (PECVD) and/or sputtering. Herein, the second conductive layer 156 is formed from Cr, MoW, Cr/Al, Cu, Al(Nd), Mo/Al, Mo/Al (Nd) or Cr/Al(Nd).

Next, a photo-resist film is coated over the second conductive layer 156 and then a photo-resist pattern 158 having a step coverage, as shown in FIG. 8A, is formed thereon by photolithography using a second mask that is a partial-exposure mask. In this case, a partial-exposure mask having a diffractive exposing part (or a semi-transmitting or transflective part) corresponding to where a channel of the thin film transistor will be subsequently formed is used as the second mask. Thus, the photo-resist pattern 158 corresponding to the diffractive exposing part (or the semi-transmitting part) of the second mask has a height lower than the photo-resist pattern 158 corresponding to a transmitting part (or a shielding part) of the second mask. In other words, the photo-resist pattern 158 at the channel portion has a height lower than the photo-resist pattern 158 at other source/drain metal pattern group portion.

Figure 8B:
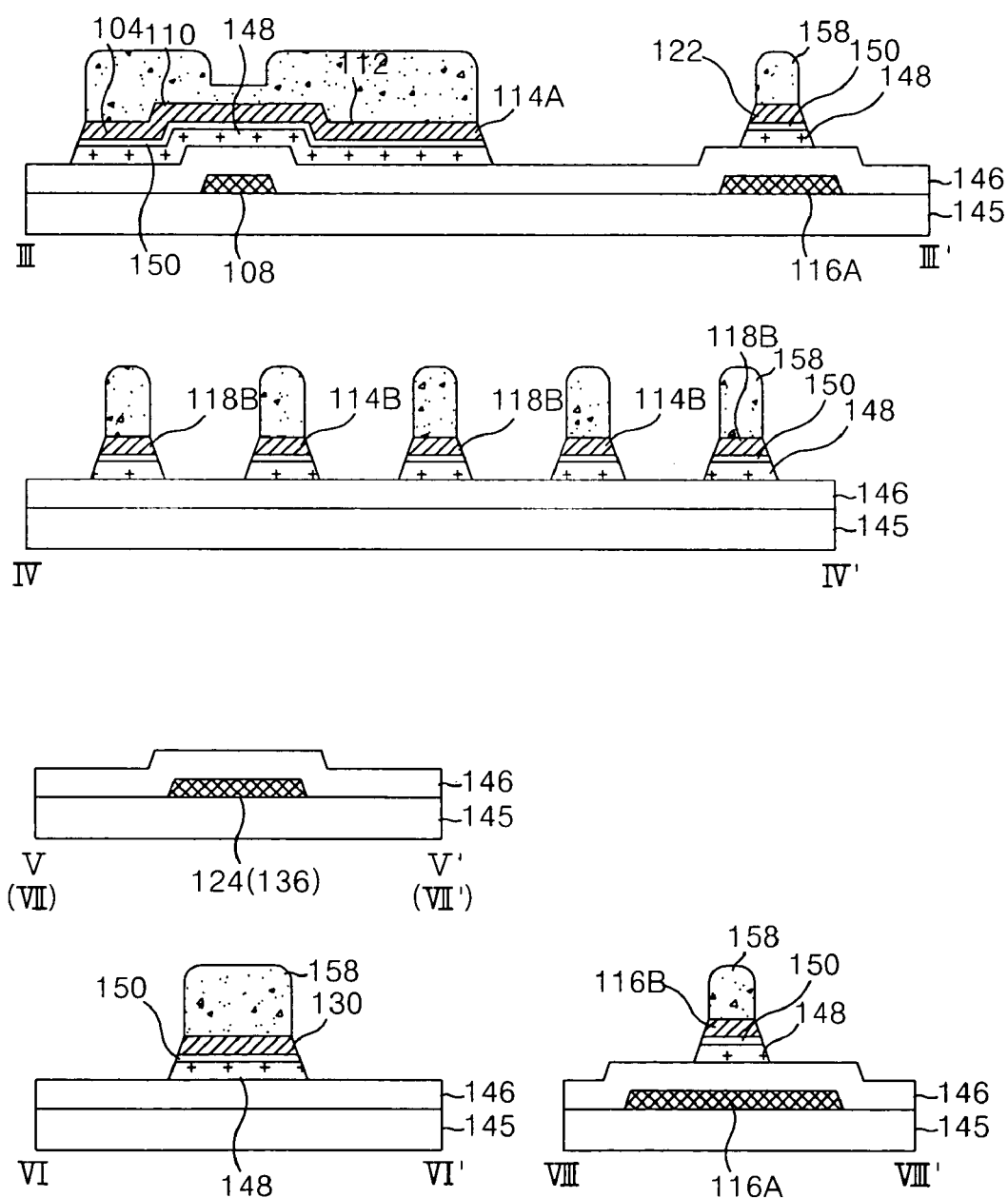

Subsequently, the second conductive layer 156 is patterned by a wet etching process using the photo-resist pattern 158. Thus, the second conductive metal pattern group including the data line 104, the source electrode 110 protruding from the data line 104, the drain electrode 112 still integral with the source electrode 110, the pixel electrode 114 still integral with the drain electrode 112, the second common line 116B parallel to the data line 104, the first and second common electrodes 118A and 118B integral with the second common line 116, the lower data pad electrode 130 extending from the data line 104 and the upper storage electrode 122 integral with the pixel electrode 114 are formed, as shown in FIG. 8B. Herein, the upper storage electrode 122 is connected between the finger parts 114B of the pixel electrode 114 in such a manner as to overlap the first common line 116A. Further, the n+ amorphous silicon layer 150A and the amorphous silicon layer 148A are patterned at the same time by a dry etching process using the same photo-resist pattern 158, to thereby provide a structure in which the ohmic contact layer 150 and the active layer 148 are formed along with the second conductive pattern group, as shown in FIG. 8B.

Figure 8C:
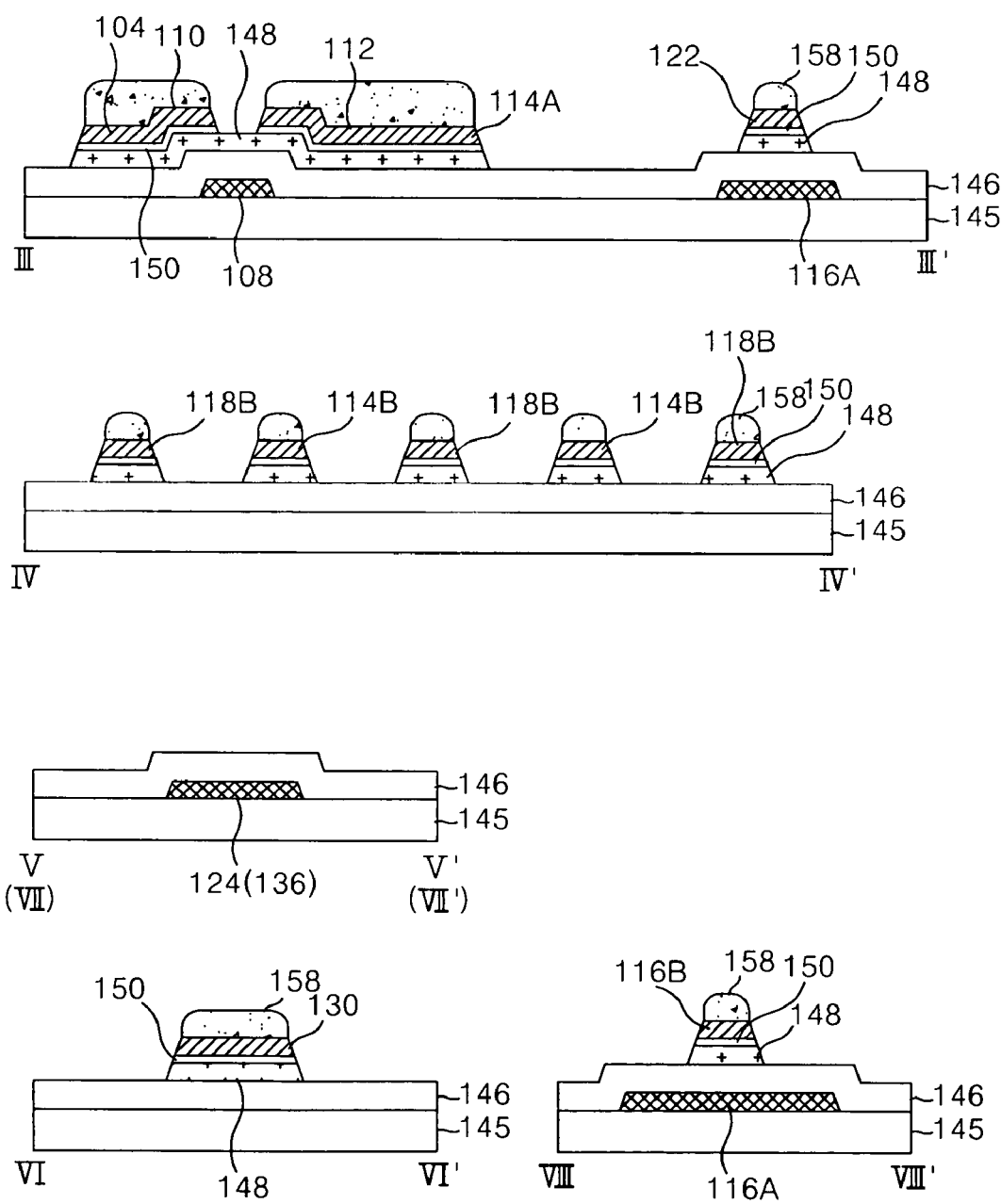
Figure 8D:
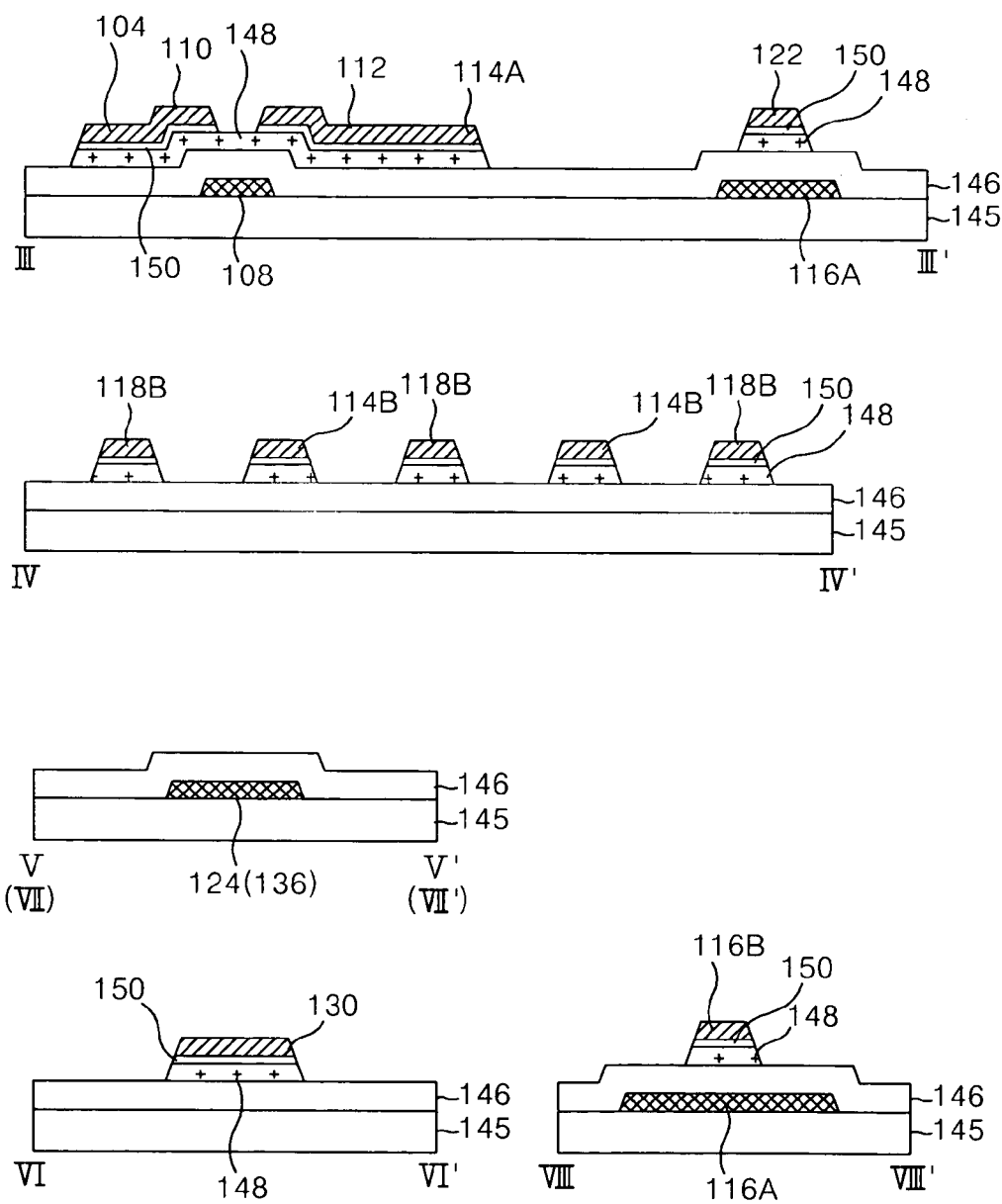

Next, the photo-resist pattern 158 at the channel portion having a relatively low height is removed, as shown in FIG. 8C, by the ashing process using oxygen ($O_2$) plasma while the photo-resist pattern 158 on the rest of the second conductive pattern group portion is lowered in height. A portion of the second conductive layer and the ohmic contact layer 150 is etched at an area corresponding to a channel part of the thin film transistor, as shown in FIG. 8C, by the dry etching process using the photo-resist pattern 158 left in this manner. This dry etching disconnects the source electrode 110 from the drain electrode 112 and exposes the active layer 148. Thus, a channel made of the active layer 148 is formed between the source electrode 110 and the drain electrode 112. Then, the remaining photo-resist pattern 158 on the second conductive pattern group portion is entirely removed, as shown in FIG. 8D by a stripping process.

Figure 9A:
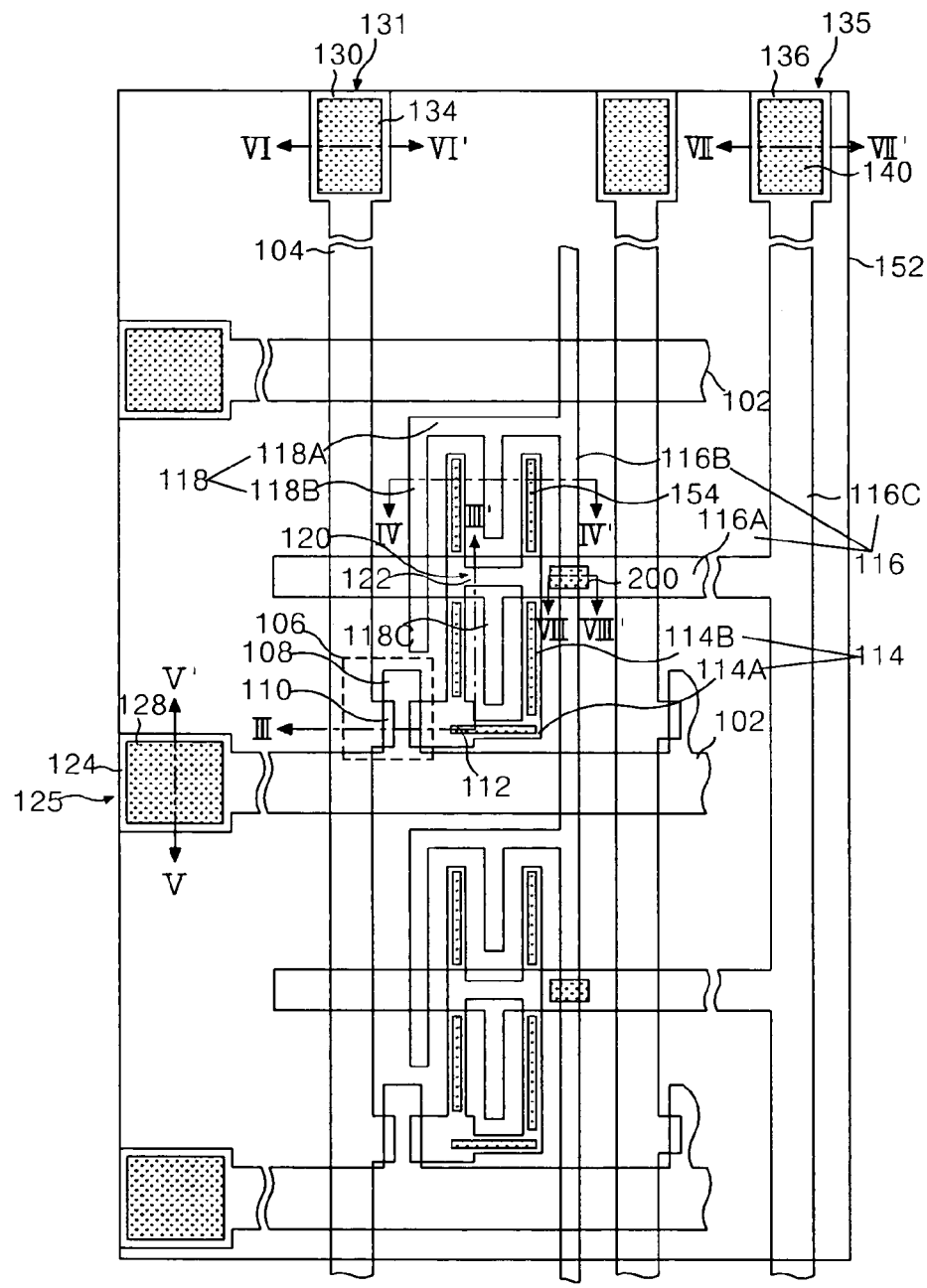
FIG. 9A and FIG. 9B are a plan view and a cross-sectional view for explaining a third mask process in a fabricating method of the thin film transistor substrate according to an embodiment of the present invention, respectively.
Figure 9B:
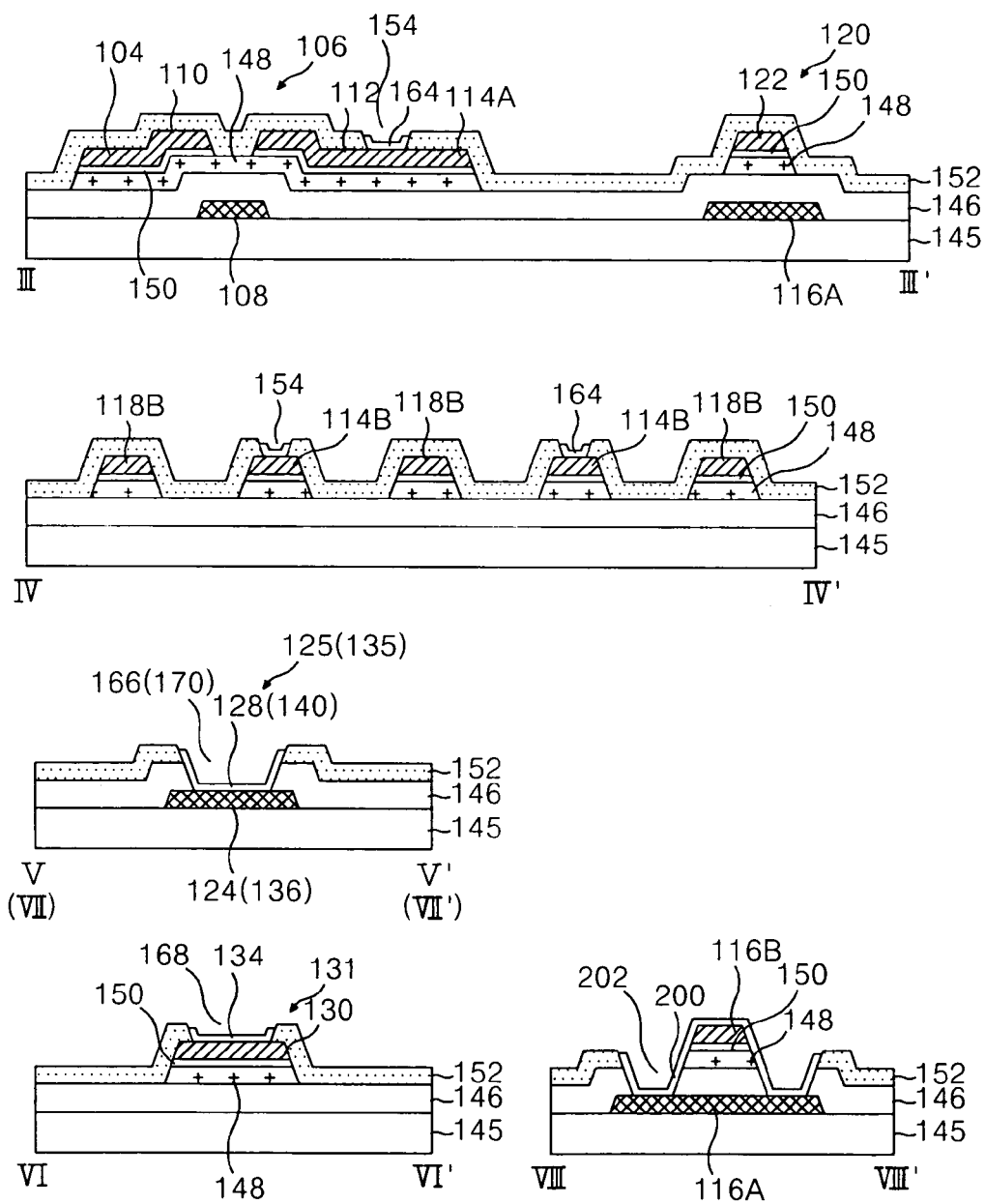

FIG. 9A and FIG. 9B are a plan view and a cross-sectional view for explaining a third mask process in a fabricating method of the thin film transistor substrate of horizontal electric field type according to an embodiment of the present invention, respectively. FIG. 10A to FIG. 10D are cross-sectional views for specifically explaining the second mask process. As shown in FIG. 9A and FIG. 9B, by the third mask process, the protective film 152 and the gate insulating film 146 are patterned to define the first to fourth contact holes 166, 170, 168 and 202; and a third conductive pattern group including the upper gate pad electrode 128, the upper data pad electrode 134, the upper common pad electrode 140 and the contact electrode 200 are respectively positioned in the first to fourth contact holes 166, 170, 168 and 202. Such a third conductive pattern group makes an interface with the patterned protective film 152 in which the patterned protective film does not overlap any of the electrodes.

Figure 10A:
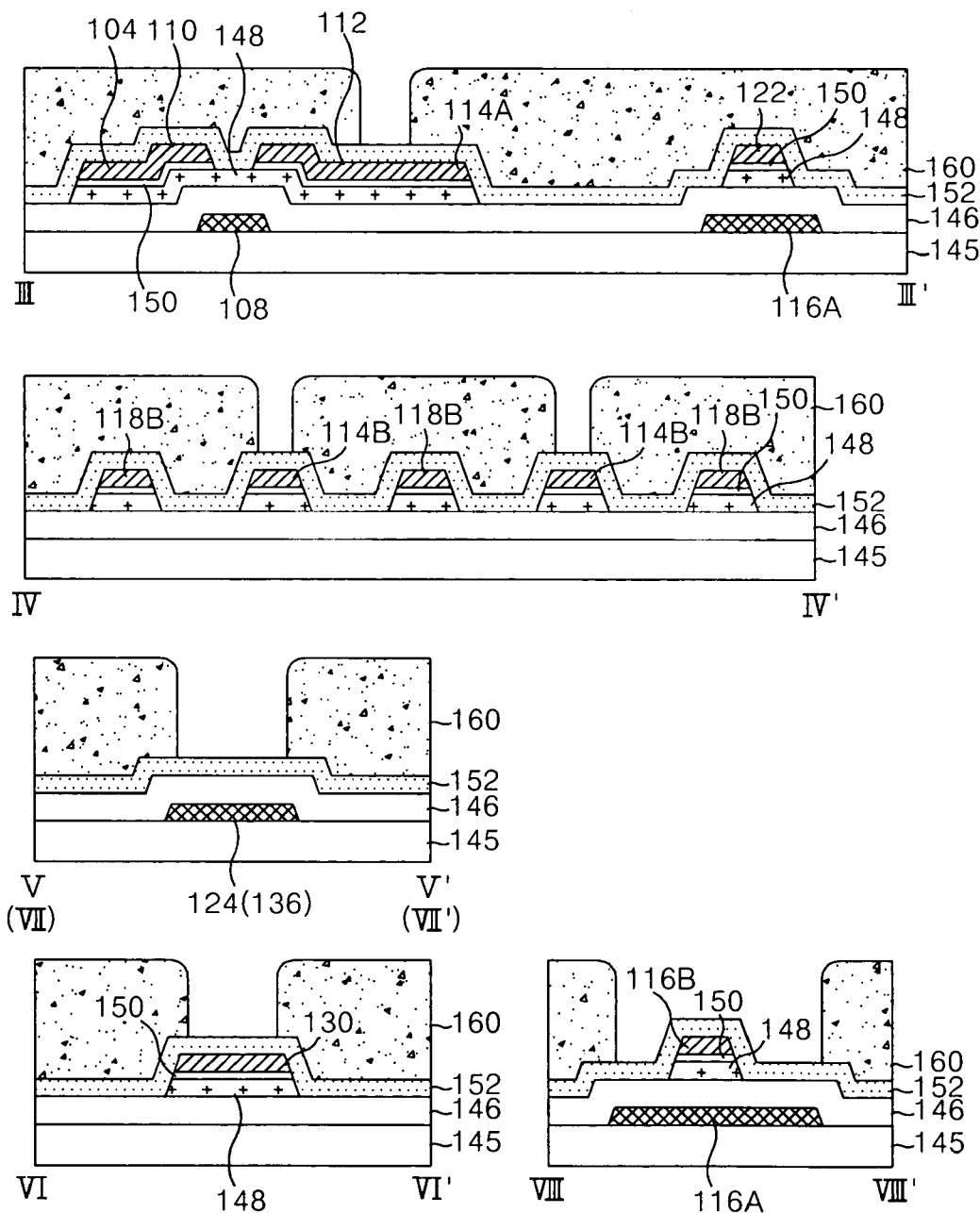
FIG. 10A to FIG. 10D are cross-sectional views for specifically explaining the third mask process in a fabricating method of the thin film transistor substrate according to an embodiment of the present invention.
Figure 10B:
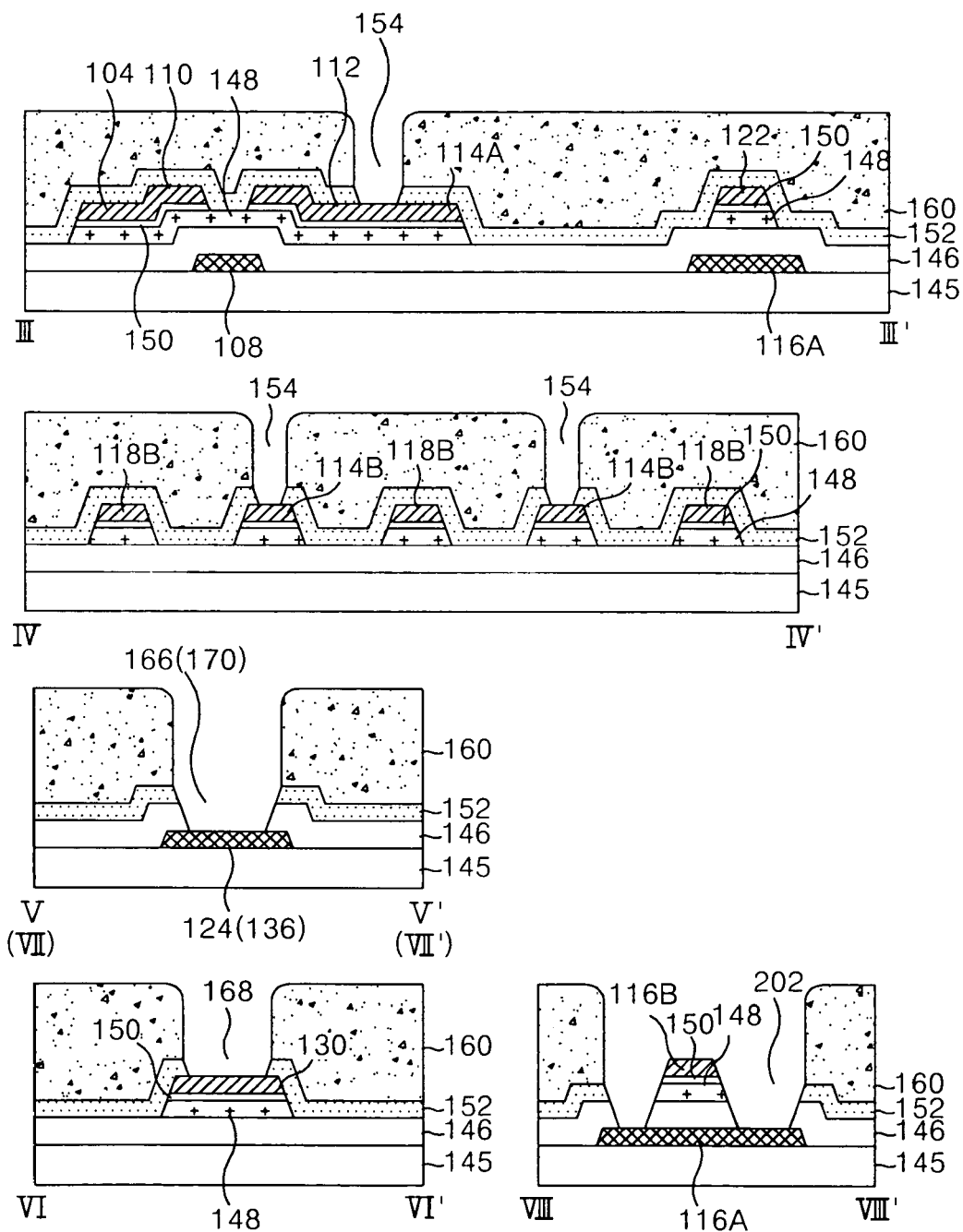

More specifically, the protective film 152 is formed over the gate insulating film 146 and the second conductive pattern group, as shown in FIG. 10A. Herein, the protective film 152 is formed from an inorganic insulating material or an organic insulating material similar to the gate insulating film 146. Further, a photo-resist pattern 160 is formed over portions where the protective film 152 are to exist, as shown in FIG. 10A, by photolithography using a third mask. Next, the protective film 152 and the gate insulating film 146 are patterned by a dry etching process using the photo-resist pattern 160 to form the first to fourth contact holes 166, 170, 168 and 202 and the stripper penetration path 154. The first and second contact holes 166 and 170 and the fourth contact hole 202 are formed in such a manner as to pass through the protective film 152 and expose the lower gate pad electrode 124, the lower common pad electrode 136 and the first and second common lines 116A and 116B, respectively. The third contact hole 168 passes through the protective film 152 to expose the lower data pad electrode 130. The stripper penetration path 154 exposes the pixel electrode 114, the common electrode 118 or the second common line 116B.

Figure 10C:
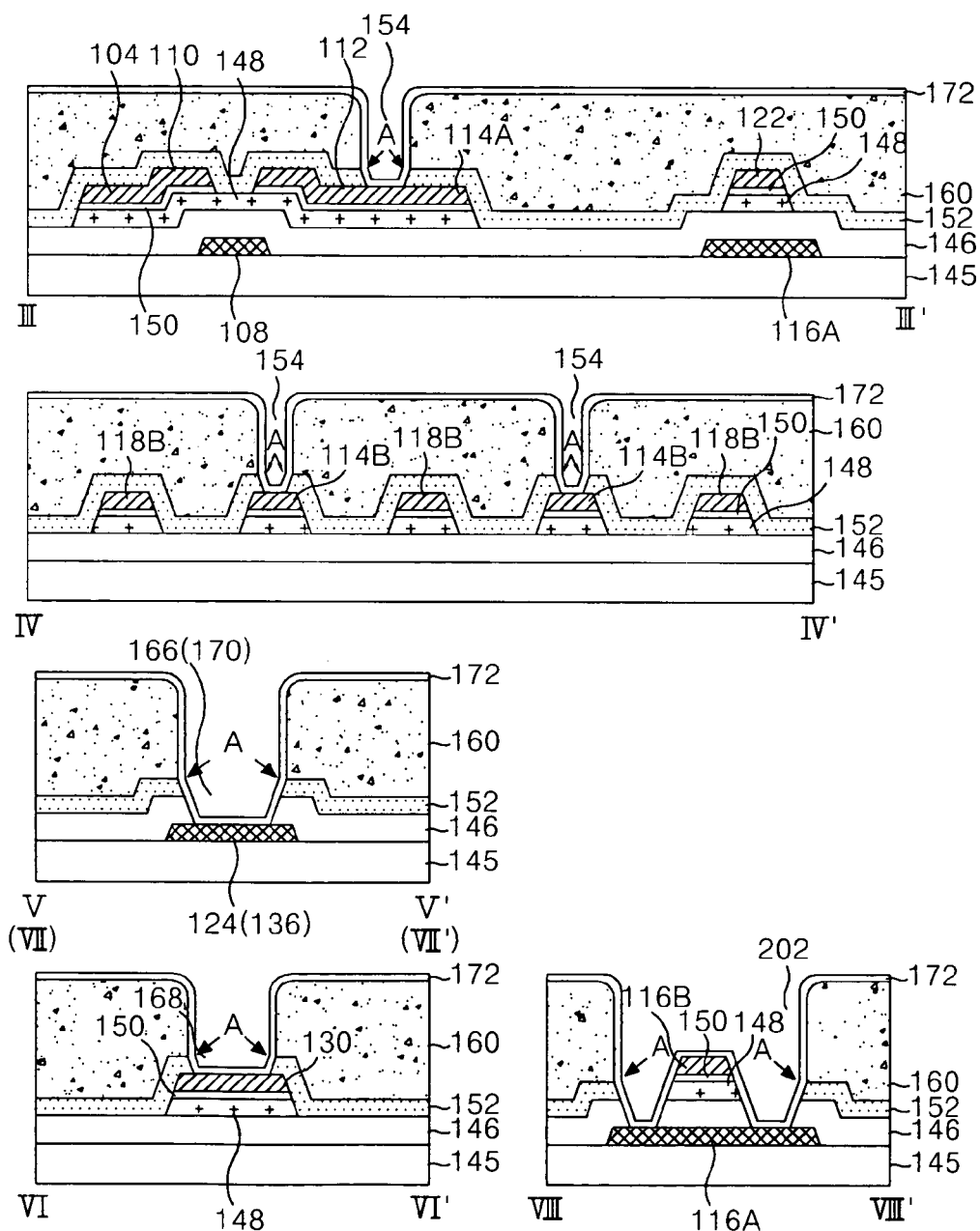

Subsequently, a third conductive layer 172 is formed over the entire thin film transistor substrate, as shown in FIG. 10C, by a deposition technique, such as sputtering and the like. The third conductive layer 172 is formed from a transparent conductive layer containing indium-tin-oxide (ITO), tin-oxide (TO), indium-zinc-oxide (IZO) or $SnO_2$. Alternatively, the third conductive film 172 is formed from a metal layer having a high corrosion-resistance and a high mechanical strength such as titanium (Ti) or tungsten (W), etc.

Figure 10D:
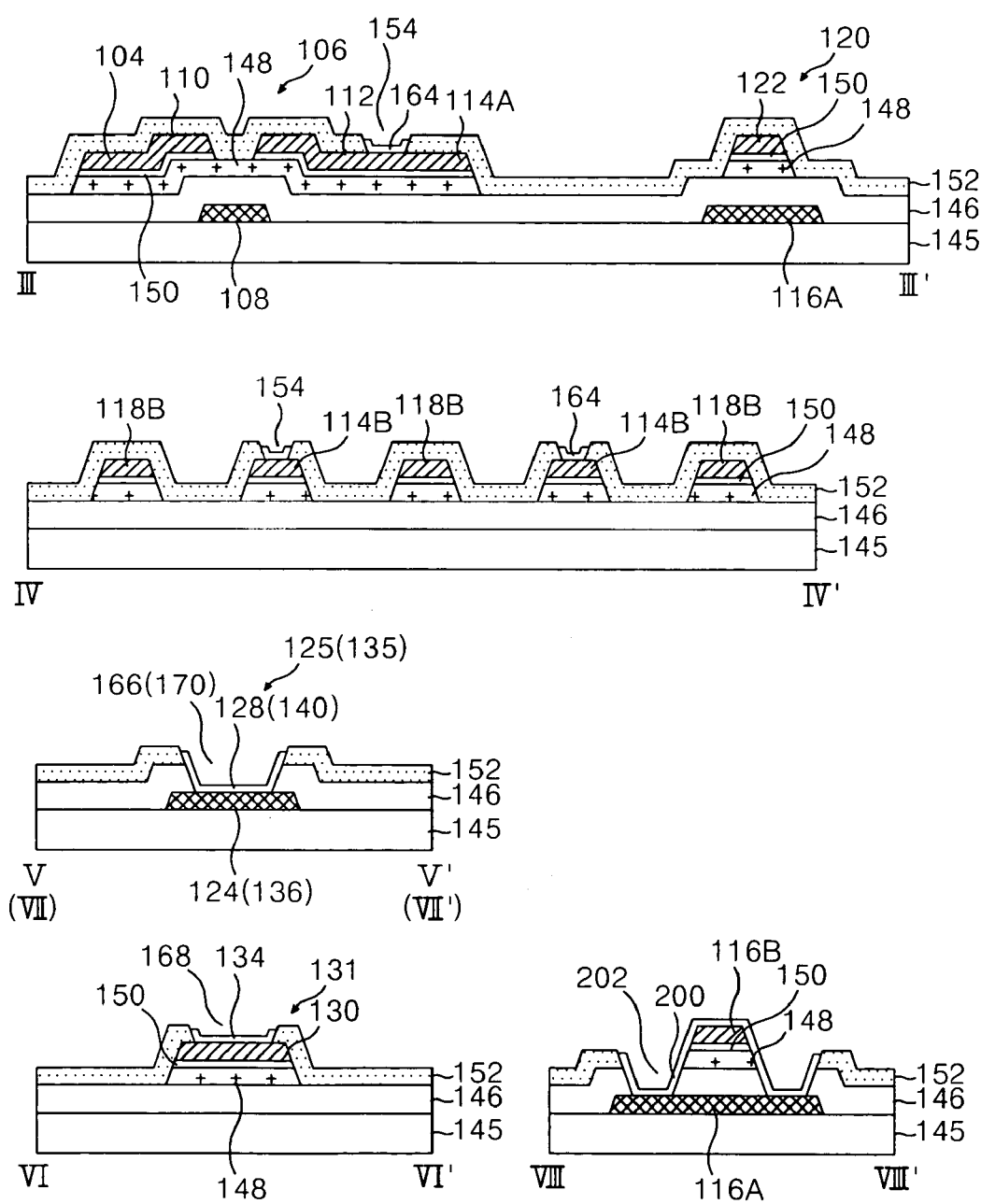

The photo-resist pattern 160, along with the third conductive layer 172 thereon, is removed by a lift-off process, to thereby pattern the third conductive layer 172. Thus, the upper gate pad electrode 128, the upper common pad electrode 140, the upper data pad electrode 134 and the contact electrode 200 are provided in the first to fourth contact holes 166, 170, 168 and 202, respectively, as shown in FIG. 10D. Further, a dummy pattern 164 is provided within the stripper penetration path 154.

In this case, the stripper penetration path 154, along with the first to fourth contact holes 162, 166, 170 and 202, is formed at a portion in which the photo-resist pattern 160 does not exist such that a greater amount of stripper A can infiltrate into the interface part between the photo-resist pattern 160 and the protective film 152. As a result, the photo-resist pattern 160 covered with the third conductive layer 172 can be easily separated from the protective film 152 by the stripper A. This is caused by the fact that the edge of the photo-resist pattern 160 has a more protruded shape (not shown) than the edge of the protective film 152 at a portion where the stripper penetration path 154 and the first to fourth contact holes 162, 166, 170 and 202 have been provided due to an over-etching of the protective film 152. Further, this is because the third conductive layer 172 is deposited with linearity between the edge of the photo-resist pattern 160 and the edge of the protective film 152 creates an opening or relatively thinly deposited third conductive layer 172 caused by the protruded edge of the photo-resist pattern 160, to thereby allow easy infiltration of the stripper.

As mentioned above, an unnecessary portion of the third conductive layer 172, along with the photo-resist pattern 160, is removed by the lift-off process, so that the third conductive pattern group can make an interface with the protective film 152. More specifically, the upper gate pad electrode 128, the upper common pad electrode 140, the upper data pad electrode 134 and the contact electrode 200 are provided within the corresponding contact holes 166, 170, 168 and 202 to be connected to the lower gate pad electrode 124, the lower common pad electrode 136, the lower data pad electrode 130 and the first and second common lines 116A and 116B, respectively. If titanium (Ti) is used as the third conductive layer 172, then it becomes possible to prevent an electro-chemical corrosion and tearing of the pad portion. Examples of a shape of the stripper penetration path 154 through the protective film 152 on the pixel electrode 114, the common electrode or the second common line 116B will be described below.

Figure 11A:
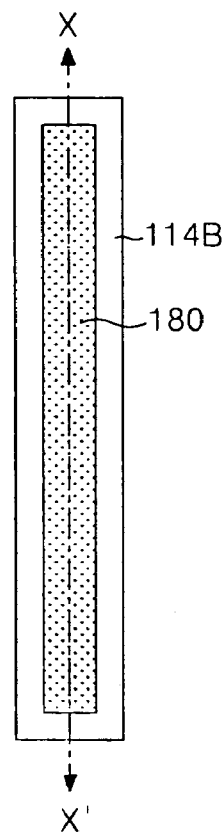
FIG. 11A and FIG. 11B are a plan view and a cross-sectional view showing one example of a penetration path of a stripper applied to the thin film transistor substrate according to the embodiment of the present invention, respectively.
Figure 11B:
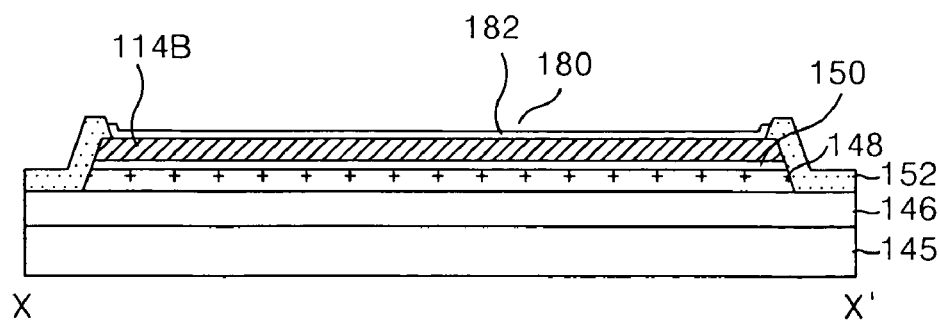

Referring to FIG. 11A and FIG. 11B, the stripper penetration path 154 is formed of a straight-shaped slit 180 through the protective film 152 over and along the pixel electrode 114. Further, the dummy conductive pattern 182 is left along the straight-shaped slit 180. Such a straight-shaped slit 180 may be provided on any one of a plurality of signal lines including the gate line, the common line and the data line and the common electrode.

Figure 12A:
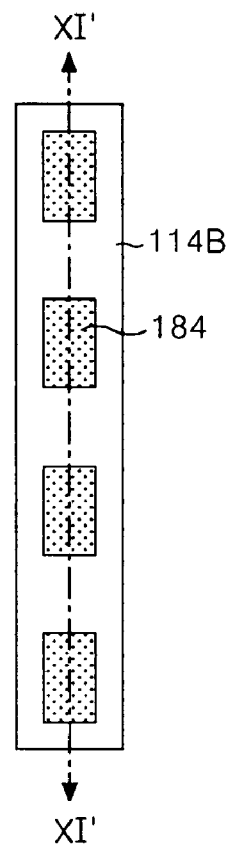
FIG. 12A and FIG. 12B are a plan view and a cross-sectional view showing another example of a penetration path of a stripper applied to the thin film transistor substrate according to an embodiment of the present invention, respectively.
Figure 12B:
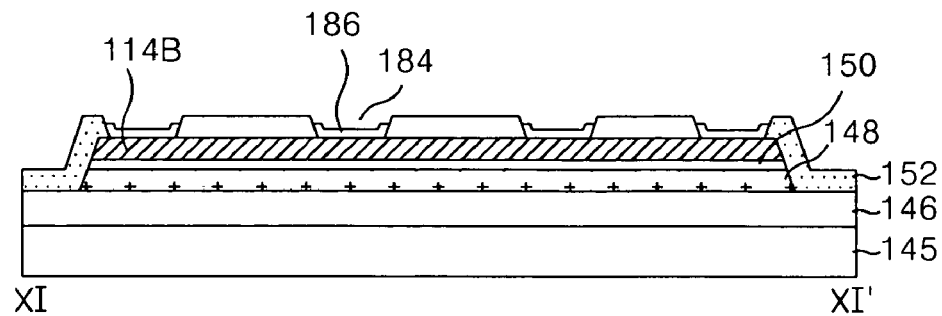

Referring to FIG. 12A and FIG. 12B, the stripper penetration path 154 can be formed of a plurality of holes 184 through the gate insulating film 146 and the protective film 152 on the pixel electrode 114. The dummy conductive pattern 186 is only left within the plurality of holes 184 so as to be separated from one another. The plurality of holes 184 may be provided on any one of a plurality of signal lines including the gate line, the common line and the data line and the common electrode.

Figure 13:
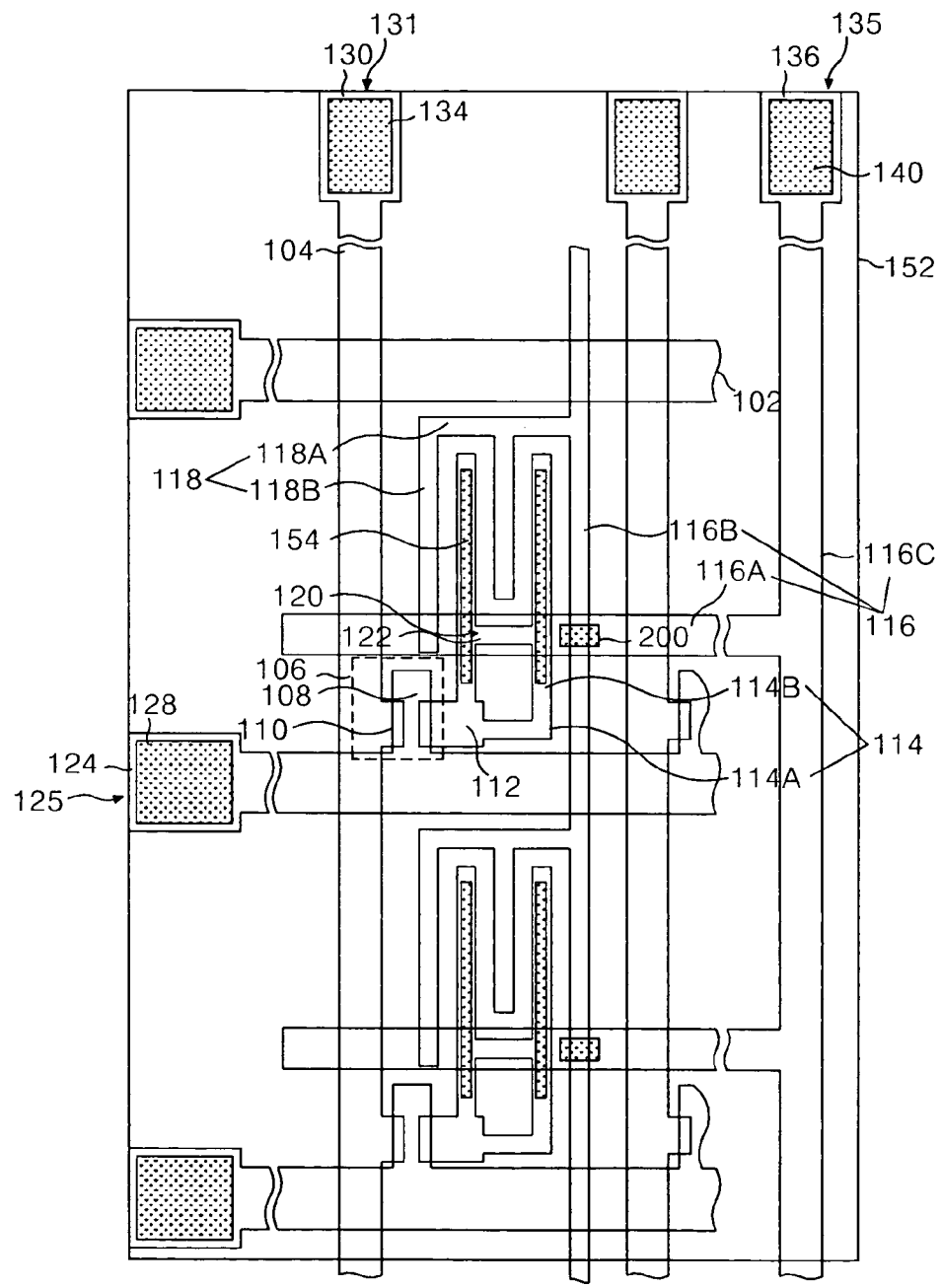
FIG. 13 is a plan view showing a structure of a thin film transistor substrate of horizontal electric field applying type according to another embodiment of the present invention.

FIG. 13 shows a thin film transistor substrate according to another embodiment of the present invention. The thin film transistor substrate shown in FIG. 13 has the same elements as that shown in FIG. 4 except that the first common line 116A is at a different position in the pixel area and there is no third common electrode 118C protruding from the first common line. Thus, an explanation as to the same elements will be omitted simplicity.

Referring to FIG. 13, the first common line 116A is provided at the lower portion of the pixel area adjacent to the thin film transistor 106. Thus, the thin film transistor substrate does not have the third common electrode protruding from the first common line 116A toward the lower side thereof. Instead, the thin film transistor substrate has a structure in which neither one of the second common electrodes 118B extends across the first common line 116A. The thin film transistor substrate having the foregoing structure also is provided by the three-round mask process adopting the lift-off process as mentioned above.

As described above, according to the embodiments of the present invention, the lift-off process is employed to eliminate the mask process for the third conductive layer. Accordingly, the thin film transistor substrate is fabricated by a three-round mask process, so that the fabrication process can be simplified to reduce the manufacturing cost and improve the production yield. Furthermore, according to the embodiments of the present invention, lift-off ability of a photo-resist pattern covering the third conductive layer can be effectively improved by a stripper penetration path over at least some of the plurality of signal lines and electrodes. Moreover, according to the embodiments of the present invention, the common electrode and the pixel electrode within the pixel area are formed from an opaque conductive layer, thereby preventing a light leakage.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor substrate of horizontal electric field type, comprising:
   a gate line and a first common line formed from a first conductive layer on a substrate to be in parallel to each other;
   a data line crossing the gate line and the first common line with a gate insulating film therebetween to define a pixel area, said data line being formed from a second conductive layer;
   a second common line formed from said second conductive layer and crossing the first common line having the gate insulating film therebetween;
   a thin film transistor connected to the gate line and the data line;
   a common electrode formed from said second conductive layer and extending from the second common line in said pixel area;
   a pixel electrode formed from said second conductive layer that is parallel to the common electrode and the second common line, the pixel electrode being connected to the thin film transistor;
   a protective film for covering the thin film transistor;
   a gate pad having a lower gate pad electrode connected to the gate line and an upper gate pad electrode connected to the lower gate pad electrode within a first contact hole, the lower gate pad electrode being formed form the first conductive layer and the upper gate pad electrode being formed form a third conductive layer;

a common pad having a lower common pad electrode connected to the first common line and an upper common pad connected to the lower common pad electrode within a second contact hole, the lower common pad electrode being formed from the first conductive layer and the upper common pad electrode being formed from the third conductive layer; and a data pad having a lower data pad electrode connected to the data line and an upper data pad electrode connected to the lower data pad electrode within a third contact hole, the lower data pad electrode being formed from the second conductive layer and the upper data pad electrode being formed form the third conductive layer.

2. The thin film transistor substrate of horizontal electric field type according to claim 1, further comprising:

a fourth contact hole for exposing the first and second common lines where the first and second common lines cross; and a contact electrode formed from the third conductive layer within the fourth contact hole to connect the first common line with the second common line.

3. The thin film transistor substrate of horizontal electric field type according to claim 2, wherein the upper gate pad electrode, the upper common pad electrode, the upper data pad electrode and the contact electrode have an interface with the protective film within the corresponding contact holes.

4. The thin film transistor substrate of horizontal electric field type according to claim 1, further comprising:

a stripper penetration path formed on at least one of said plurality of signal lines and electrodes.

5. The thin film transistor substrate of horizontal electric field type according to claim 4, wherein the stripper penetration path goes through the gate insulating film and the protective film.

6. The thin film transistor substrate of horizontal electric field type according to claim 4, wherein the stripper penetration path includes a slit or a plurality of holes provided along over the at least one of said plurality of signal lines and electrodes.

7. The thin film transistor substrate of horizontal electric field type according to claim 4, wherein the stripper penetration path is provided on at least one of the common electrode, the pixel electrode and the second common line within the pixel area.

8. The thin film transistor substrate of horizontal electric field type according to claim 4, wherein a dummy conductive pattern formed from said third conductive layer is left within the stripper penetration path in such a manner as to make an interface with the protective film.

9. The thin film transistor substrate of horizontal electric field type according to claim 1, further comprising:

a storage capacitor having a lower storage electrode, which is part of the first common line, and a upper storage electrode connected to finger parts of the pixel electrode with the gate insulating film therebetween, the upper storage electrode being formed from the second conductive layer.

10. The thin film transistor substrate of horizontal electric field type according to claim 1, wherein the common electrode includes:

a first common electrode formed from the second conductive layer extending from a second common electrode line; and a second common electrode of the second conductive layer extending from the first common electrode and in parallel to the pixel electrode.

11. The thin film transistor substrate of horizontal electric field type according to claim 10, wherein the common electrode includes:

a third common electrode formed from the first conductive layer extending from the first common line and in parallel to the pixel electrode.

12. The thin film transistor substrate of horizontal electric field type according to claim 1, further comprising:

a third common line formed from the first conductive layer connected between the first common line and the lower common pad electrode in a non-display area.

13. The thin film transistor substrate of horizontal electric field type according to any one of claims 1, wherein a semiconductor layer included in the thin film transistor overlaps the plurality of signal lines and electrodes formed from the second conductive layer.

* * * * *